(12) United States Patent
Kuhara

(10) Patent No.: US 7,336,076 B2
(45) Date of Patent: Feb. 26, 2008

(54) MAGNETIC RESONANCE IMAGING INVOLVING MOVEMENT OF PATIENT'S COUCH

(75) Inventor: Shigehide Kuhara, Otawara (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 11/808,460

(22) Filed: Jun. 11, 2007

(65) Prior Publication Data

US 2007/0247159 A1    Oct. 25, 2007

Related U.S. Application Data

(62) Division of application No. 11/594,111, filed on Nov. 8, 2006, which is a division of application No. 11/075,269, filed on Mar. 9, 2005, now Pat. No. 7,190,164, which is a division of application No. 09/841,171, filed on Apr. 25, 2001, now Pat. No. 6,946,836.

(30) Foreign Application Priority Data

Apr. 25, 2000    (JP) ............................ 2000/124819

(51) Int. Cl.
*G01V 3/00*    (2006.01)

(52) U.S. Cl. ....................... 324/318; 324/307; 324/309

(58) Field of Classification Search ......... 324/300–322

See application file for complete search history.

(56) References Cited

U.S. PATENT DOCUMENTS

| 4,830,012 A | 5/1989 | Riederer |
| 4,875,485 A | 10/1989 | Matsutani |

(Continued)

FOREIGN PATENT DOCUMENTS

GB    2 350 682    12/2000

(Continued)

OTHER PUBLICATIONS

Jones, R. A. et al., "Dynamic, Contrast Enhanced, NMR Perfusion Imaging of Regional Cerebral Ischaemia in Rats Using K Space Substitution", SMRM 1138, Aug. 8-14, 1992, 3 pp.

(Continued)

*Primary Examiner*—Brij Shrivastav
*Assistant Examiner*—Dixomara Vargas
(74) *Attorney, Agent, or Firm*—Nixon & Vanderhye, PC

(57) ABSTRACT

A magnetic resonance imaging system performing various types of imaging that involves movement of a patient's couch. The system has a patient's couch having a tabletop movable in a predetermined direction passing through a static magnetic field as well as reception multiple RF coils consisting of for example a plurality of coil groups. The tabletop is automatically moved in its longitudinal direction in accordance with a length of each coil group in the predetermined direction. At each moved position, scanning is performed on a given pulse sequence. An echo signal is received through the multiple RF coils, then switched over by an input switchover unit to be sent to a receiving-system circuit. The echo signal is subjected to given processing in this circuit so that it is converted to echo data. The echo data are produced into an MR image by a host computer.

7 Claims, 16 Drawing Sheets

U.S. PATENT DOCUMENTS

| | | | |
|---|---|---|---|
| 5,197,474 A | 3/1993 | Englund et al. | |
| 5,309,104 A | 5/1994 | Frederick | |
| 5,384,536 A | 1/1995 | Murakami et al. | |
| 5,461,314 A | 10/1995 | Arakawa et al. | |
| 5,510,711 A | 4/1996 | Molyneaux et al. | |
| 5,539,316 A | 7/1996 | Sukumar | |
| 5,551,430 A | 9/1996 | Blakeley et al. | |
| 5,585,724 A | 12/1996 | Morich et al. | |
| 5,713,358 A | 2/1998 | Mistretta et al. | |
| 5,909,119 A | 6/1999 | Zhang et al. | |
| 5,924,987 A | 7/1999 | Meaney et al. | |
| 5,928,148 A | 7/1999 | Wang et al. | |
| 6,147,492 A | 11/2000 | Zhang et al. | |
| 6,262,576 B1 | 7/2001 | Petropoulos | |
| 6,263,228 B1 | 7/2001 | Zhang et al. | |
| 6,278,276 B1 | 8/2001 | Morich et al. | |
| 6,289,232 B1 | 9/2001 | Jakob et al. | |
| 6,356,780 B1 | 3/2002 | Licato et al. | |
| 6,380,741 B1 | 4/2002 | Hajnal et al. | |
| 6,396,269 B1 | 5/2002 | Hajnal et al. | |
| 6,445,181 B1 | 9/2002 | Pelc et al. | |
| 6,459,922 B1 | 10/2002 | Zhang | |
| 6,556,009 B2 | 4/2003 | Kellman et al. | |
| 6,717,406 B2 | 4/2004 | Sodickson | |
| 6,946,836 B2 * | 9/2005 | Kuhara | 324/307 |
| 7,009,396 B2 * | 3/2006 | Zhu et al. | 324/309 |
| 7,190,164 B2 * | 3/2007 | Kuhara | 324/309 |
| 2007/0145978 A1 * | 6/2007 | Kuhara | 324/318 |

FOREIGN PATENT DOCUMENTS

JP    2001-198100    7/2001

OTHER PUBLICATIONS

Pruessmann, Klass P. et al., "SENSE: Sensitivity Encoding for Fast MRI", MRM 42:952-962 (1999).

Ra, J. B. et al., "Fast Imaging Method Using Multiple Receiver Coils with Subencoding Data Set", 10th Annual Meeting SMRM 1240, 1991.

Ra, J.B. et al., "Fast Imaging Using Subencoding Data Sets from Multiple Detectors", MRM 30:142-145 (1993).

* cited by examiner

MAGNETIC RESONANCE IMAGING INVOLVING MOVEMENT OF PATIENT'S COUCH

CROSS-REFERENCE TO RELATED APPLICATIONS

This application is a divisional of U.S. patent application Ser. No. 11/594,111, filed Nov. 8, 2006, pending, which is a divisional of Ser. No. 11/075,269, filed Mar. 9, 2005, now U.S. Pat. No. 7,190,164; which is a divisional of U.S. patent application Ser. No. 09/841,171, filed Apr. 25, 2001, now U.S. Pat. No. 6,946,836; which claims priority to Japanese Patent Application No. 124819/2000, filed Apr. 25, 2000. The entire contents of these applications are incorporated herein by reference.

BACKGROUND OF THE INVENTION

1. Field of the Invention

The present invention relates to a magnetic resonance imaging (MRI) system and a magnetic resonance imaging method, which are used for medical purposes, and in particular, to a system and method enabling fast and/or wide-range imaging with a couch (tabletop) on which a patient (object to be imaged) is laid.

2. Description of Related Art

Magnetic resonance imaging is a technique for magnetically exciting nuclear spins in an object located in a static magnetic field by applying a radio-frequency (RF) signal with the Larmor frequency, and reconstructing an image of the object using an FID (free induction decay) signal or echo signal induced by the excitation. In the field of magnetic resonance imaging, like imaging using other modalities, a wide variety of imaging techniques have been developed thanks to recent advancements in hardware.

For example, for imaging blood vessels in the inferior limb, various imaging techniques are already known. Normally, imaging the inferior limb requires an imaged region to be wider in the body axis direction. Further, it is also required that imaging in such a wider range be finished during an interval of time during which a contrast agent remains in the inferior limb. Hence imaging should be done at a higher speed (in a shorter time) and in a higher temporal resolution.

One technique, which is able to have a wider imaging range, is an imaging technique in which the patient is moved on a couch, called a moving bed technique, by which the imaging is done with a patient's couch moved. When this technique is used, the first scan for a given region is conducted at a certain patient's couch location, the couch (patient) is moved by a distance corresponding to the given region, and then a second scan is conducted for the next region to be imaged. This combination of scans and couch movements is repeated in turn, so that a desired region to be imaged, such as the inferior limb, is entirely covered. After the imaging, the obtained images are lined up in, for example, the body axis direction or combined into a single image to be used for diagnosis.

The moving bed technique includes a first technique that uses a whole-body coil with the couch moved and a second technique that uses multiple RF coils.

In the case of the technique involving the whole-body coil, the whole-body coil is fixed to a magnet. The couch is moved stepwise by a distance equal to a predetermined region to be imaged, and after each movement to a new region to be imaged, imaging is done.

FIG. 1 exemplifies a magnetic resonance imaging system capable of performing the moving bed technique by which a whole-body coil 101 is used. In the figure, reference 102 is a magnet that generates a static magnetic field. Connected to the whole-body coil 101 through a duplexer 103 are a transmitter 104 and a preamplifier 105. The preamplifier 105 is connected to a receiving-system circuit 106, both of which make up a receiver. A host computer 107 responsible for control of the whole system is placed to control a transmitter 104 and a gradient amplifier 109 via a sequencer 108, so that a given pulse sequence is performed. Connected to the host computer 107 are an input device 109, display 110, and storage 111. The host computer 107 controls a couch driver (not-shown) to move a tabletop 112 of the couch based on the moving bed technique.

On the other hand, when the second technique is used with multiple RF coils, the multiple RF coils themselves are fixed to an object or the couch, so the coil can be moved with the couch. The multiple RF coils consist of, for example, a plurality of sets of coil members (a group of coils) disposed in an array. In this case, in response to movement of the couch under imaging, each set of coil members enters a uniform static field region within a magnet's bore, and then exists therefrom.

When it is desired to use the multiple RF coils based on the moving bed technique, it is conceivable that a plurality of images obtained through a plurality of sets of coil elements are made to cover all of a desired region to be imaged of an object.

FIG. 2 exemplifies a magnetic resonance imaging system that is able to execute the moving bed technique with such multiple RF coils. The multiple RF coils 121 consist of three sets of coil members (coil groups) 1 to 3. Each set of the coil members 1 to 3 is independently routed to a host computer 107 through a preamplifier 105a (to 105c) and a receiving-system circuit 106a (to 106c), respectively. That is, the multi RF coil 121 and the circuitry to receiver and process detected signals of the coil are added to the constitution shown in FIG. 1.

Meanwhile, to meet the foregoing requirements of shortening the imaging time, higher-performance technologies in the hardware, as in improvement of a booster technology to shorten a switchover time of gradients, are now under development.

As another imaging technique, high-temporal-resolution dynamic imaging is known for observing the passage of a contrast agent at high temporal resolution. This imaging includes a key-hole imaging technique (for example, refer to "R. A. Jones at al., "Dynamic, contrast enhanced, NMR perfusion imaging of regional cerebral ischaemia in rats using k space substitution" SMRM 1992, p. 1138) and a view share technique (for example, refer to U.S. Pat. No. 4,830,012). When the key-hole imaging technique is used, data for one image is acquired first, and then dynamic imaging is done, during which time only data mapped in a central part of the k-space used for image reconstruction are updated. Meanwhile, the view share technique, which abandons the procedures of updating all the k-space with new data before reconstructing the k-space into an new image, uses the k-space previously divided in a plurality of regions. An image is reconstructed whenever a plurality of divided regions of the k-space are partly replaced with new acquired data, thus raising an image update rate. Another known imaging technique is called 3D-TRICKS (for example, U.S. Pat. No. 5,713,358, which is provided by improving the key-hole imaging technique to 3D MRA. The central part of the k-space is therefore raised in the data update rate with respect to the remaining region, so that the key-hole imaging technique is effective in observing the passage of a contrast agent at higher temporal resolution than that of the normal view share technique.

However, the above various types of conventional techniques have some drawbacks. For using the moving bed technique that involves the multiple RF coils to widen a region to be imaged, it is required that a plurality of sets of coil elements be switched over to select one set located at the uniform static field region whenever the couch is moved by an amount corresponding to the length of a region to be imaged. In order to realize this, as an operator observes the couch that is under stepwise movement, the operator must manually switch over one set of coil elements to another set. This complicates operations and lacks accuracy, in addition to taking much time.

Further, the current hardware techniques are still lacking when realizing both of the shortened imaging time and the higher temporal resolution. The foregoing key-hole imaging and other imaging techniques are still short of temporal resolution. In addition, the foregoing imaging techniques such as the key-hole imaging is simply raising apparent temporal resolution by updating data mapped in part of the k-space, thus lacking a depiction performance of minute structures. Moreover, the foregoing imaging techniques such as the key-hole imaging can be applied only to a situation that a region to be imaged of an object is constant and changes of intensity at part of the region to be imaged, which is due to a contrast agent, are observed. But those techniques are unavailable for imaging that requires the couch to be moved such that different regions are sequentially subject to imaging at a high speed.

Recently, concerning this fast imaging, a technique of gaining a shortened imaging time by using multiple RF coils has been spotlighted (for example, refer to "$10^{th}$" Ann. Scientific Meeting SMRM 1240 (1991)," which is effective in speeding up approximately all types of magnetic resonance imaging techniques. This technique enables imaging to be performed with using less encoding steps than necessary for reconstructing a single image. The resultant folded data (i.e., aliasing) is dissolved based on the fact that a plurality of coil elements constituting the multiple RF coils are different in their sensitivity distributions from each other, so that images with no folded data are obtained. Since this fast imaging allows the number of encoding steps to be lessened in proportion to the number of coil elements, unlike the ordinal imaging methods, the imaging time can be shortened.

However, the moving bed technique involving a single whole-body coil cannot be applied to such fast imaging. Further, in cases the moving bed technique involving multiple RF coils is applied to the fast imaging, it is necessary that an operator switch over a plurality of sets of coil elements, as described before. This means that the fast imaging cannot provide its merits satisfactorily.

SUMMARY OF THE INVENTION

The present invention has been made to overcome the deficiencies of the foregoing imaging techniques. A first object of the present invention is to reduce operational work, speed up imaging, and increasing accuracy in moving a patient's couch when multiple RF coils are used as a reception RF coil so as to perform imaging based on the moving bed technique (method of moving the couch).

A second object of the present invention is to easily perform the fast imaging with improved temporal resolution, so that MR images of which depiction performance is improved are provided, in cases multiple RF coil are used as a reception RF coil so as to perform imaging based on the moving bed technique.

Still, a third object of the present invention is to provide fast imaging by moving the couch (tabletop) on which an object is laid, even when only one reception RF coil is used.

Still further, a fourth object of the present invention is to perform contrast MR angiography at higher speed based on movement of the couch (tabletop) on which an object is laid, thus raising flexibility of the moving bed technique.

In order to accomplish the above objects, as one example of one aspect of the present invention, there is provided a magnetic resonance imaging system that comprises static magnetic field generating means for generating a static magnetic field containing a uniform region whose magnetic intensity is uniform; a couch movable in a predetermined direction passing through the static magnetic field, an object to be imaged being laid on the couch; a reception multiple RF coil including a plurality of coil members disposed toward the object; position changing means for automatically changing a relative position formed between the couch and the static magnetic field generating means in the predetermined direction in accordance with a length of each of the plurality of coil members detected in the predetermined direction; scanning means for scanning the object by applying a given train of pulses to the object at each position changed by the position changing means; reception means for receiving through the multiple RF coils an echo signal that emanates responsively to the application of the train of pulses by the scanning means; reception-processing means for processing, with given processing for reception, the echo signal received by the reception means so that the echo signal is converted into echo data; and image producing means for producing an MR image based on the echo data converted by the reception-processing means.

Preferably, the predetermined direction is a longitudinal direction of the couch and the position changing means is composed by means for moving a position of the couch in the longitudinal direction with the static magnetic field generating means being fixed. In such a case, the position changing means is composed by means for changing the position so that a center position of each of the plurality of coil members in the longitudinal direction corresponds to the uniform region of the static magnetic field. Further, the reception processing means may include selection means for automatically selecting, from the echo signals received individually by the plurality of coil elements, the echo signal received by a certain coil member located at the center of the uniform region in the longitudinal direction, the selected echo signal being given to the image producing means. For example, the selection means is able to include signal level detecting means for detecting a level of the echo signal received by each of the plurality of coil members, and signal selecting means for automatically selecting the echo signal received by the coil member located at the center of the uniform region in the longitudinal direction on the basis of changes in the level of the echo signal detected by the signal level detecting means.

Still preferably, the system may further comprise ID (identification) generating means for generating an ID number inherent to each coil member, the ID producing means being disposed with each of the plurality of coil members, size memorizing means for memorizing a size of each of the plurality of coil members in the longitudinal direction, the size corresponding to the ID number of each coil member generated by the ID generating means, disposal detecting means for identifying each signal line of the plurality of coil members so as to detect a disposal state of the plurality of coil members in the longitudinal direction, and determination means for determining the size by making detection information about the coil disposal state detected by the disposal detecting means refer to the size memorizing means, the position changing means includes means for moving the position of the couch based on the size determined by the determination means, and the reception-processing means includes selection means for automatically selecting, from the echo signal received by each of the plurality of coil members, a certain echo signal received by the coil member located at the center of the uniform region in the longitudinal direction on the basis of the size determined by the determination means and the coil disposal state detected by the disposal detecting means, the detected echo signal being given to the image producing means.

It is also preferred that the pulse sequence is set to include the number of encoding steps less than a given number of encoding steps required for reconstructing the MR image by one, the position changing means is composed of means for changing the position so that, of the plurality of coil members constituting the multiple RF coils, an overlapped region of sensitivity distribution regions of any two members which are mutually-adjoining agrees with the uniform region of the static magnetic field in the longitudinal direction and moving the couch step by step by a distance corresponding to each coil member in the longitudinal direction, and the image producing means is composed of means for performing unfolding processing on a set of the echo data obtained by the reception processing means at every position of the couch changed by the position changing means on the basis of different sensitivity distributions of the plurality of coil members.

Preferably, each of the plurality of coil members constituting the multiple RF coils is an array type of RF coil has a plurality of coil elements.

Still, by way of example, each of the plurality of coil members constituting the multiple RF coils is a whole-body coil.

Further, the multiple RF coils may be fixed to one selected from a group of the object and the couch.

According to another example of the magnetic resonance imaging system according to the present invention, the system comprises static magnetic field generating means for generating a static magnetic field containing a uniform region whose magnetic intensity is uniform; a couch movable in a predetermined direction passing through the static magnetic field, an object to be imaged being laid on the couch; at least a single reception RF coil disposed fixedly to the static magnetic field generating means; position changing means for automatically changing a relative position formed between the couch and the static magnetic field generating means in the predetermined direction; scanning means for scanning the object by applying a given train of pulses to the object at each position changed by the position changing means; reception means for receiving through the reception RF coil an echo signal that emanates responsively to the application of the train of pulses by the scanning means; reception-processing means for processing, with given processing for reception, the echo signal received by the reception means so that the echo signal is converted into echo data; and image producing means for producing an MR image based on the echo data converted by the reception-processing means.

By way of example, the reception RF coil is one in number. For instance, the reception RF coil is a whole-body coil used in common for transmission and reception. In such a case, the train of pulses is set to include the number of encoding steps less than a given number of encoding steps required to reconstruct the MR image by one, and the image producing means is composed of means for performing unfolding processing on a set of the echo data obtained by the reception processing means at every position of the couch changed by the position changing means on the basis of different sensitivity distributions of the plurality of coil members. As an example, the position changing means is composed of means for moving the couch every half of a length of the reception RF coil in the predetermined direction.

Still it is preferred that the position changing means may be composed of means for moving the couch to a first couch position and a second couch position, a region to be imaged of the object being located at the first couch position with the region shifted in part from a sensitivity distribution region of the reception RF coil; and the region being located at the second couch position with the region contained entirely in the sensitivity distribution region of the reception RF coil, the system further including instruction means for instructing a contrast agent to be injected into the object when the couch is located at the second position. In such a case, as one example, the train of pulses is set to include the number of encoding steps less than a given number of encoding steps required to reconstruct the MR image by one, the scanning means is composed of means for performing both a first sensitivity-distribution measuring scan for measuring a sensitivity distribution of the reception RF coil and a first imaging scan for obtaining the MR image of the region when the couch is located at the first couch position, and for performing both a second sensitivity-distribution measuring scan for measuring a sensitivity distribution of the reception RF coil and a plurality of times of second imaging scans for obtaining the MR image of the region when the couch is located at the second couch position, and the image producing means includes means for reconstructing the echo data obtained by both of the first and second imaging scans into image data and means for unfolding the image data obtained through each of the second imaging scans by using both of the echo data obtained through the first and second sensitivity-distribution measuring scans and the image data obtained through the first imaging scan.

Still, for example, the reception RF coil is one in number.

According to a further aspect of the present invention, there is provided an MR imaging method of obtaining an image of an object based on a sub-encoding technique (fast imaging technique) using a reception RF coil, the object being laid on a couch, the method comprising the steps of: acquiring by acquiring means data of coil sensitivity distributions of the reception RF coil and image data at a plurality of positional relationships between a region to be imaged of the object and the reception RF coil; and unfolding by data processing means the image data acquired at each position of the object using the data of the coil sensitivity distributions.

The remaining configurations and features of the present invention will be described in the embodiments and with appended drawings.

DETAILED DESCRIPTION OF THE PREFERRED EMBODIMENTS

Embodiments of the present invention will now be descried with reference to accompanied drawings.

Figure 3:
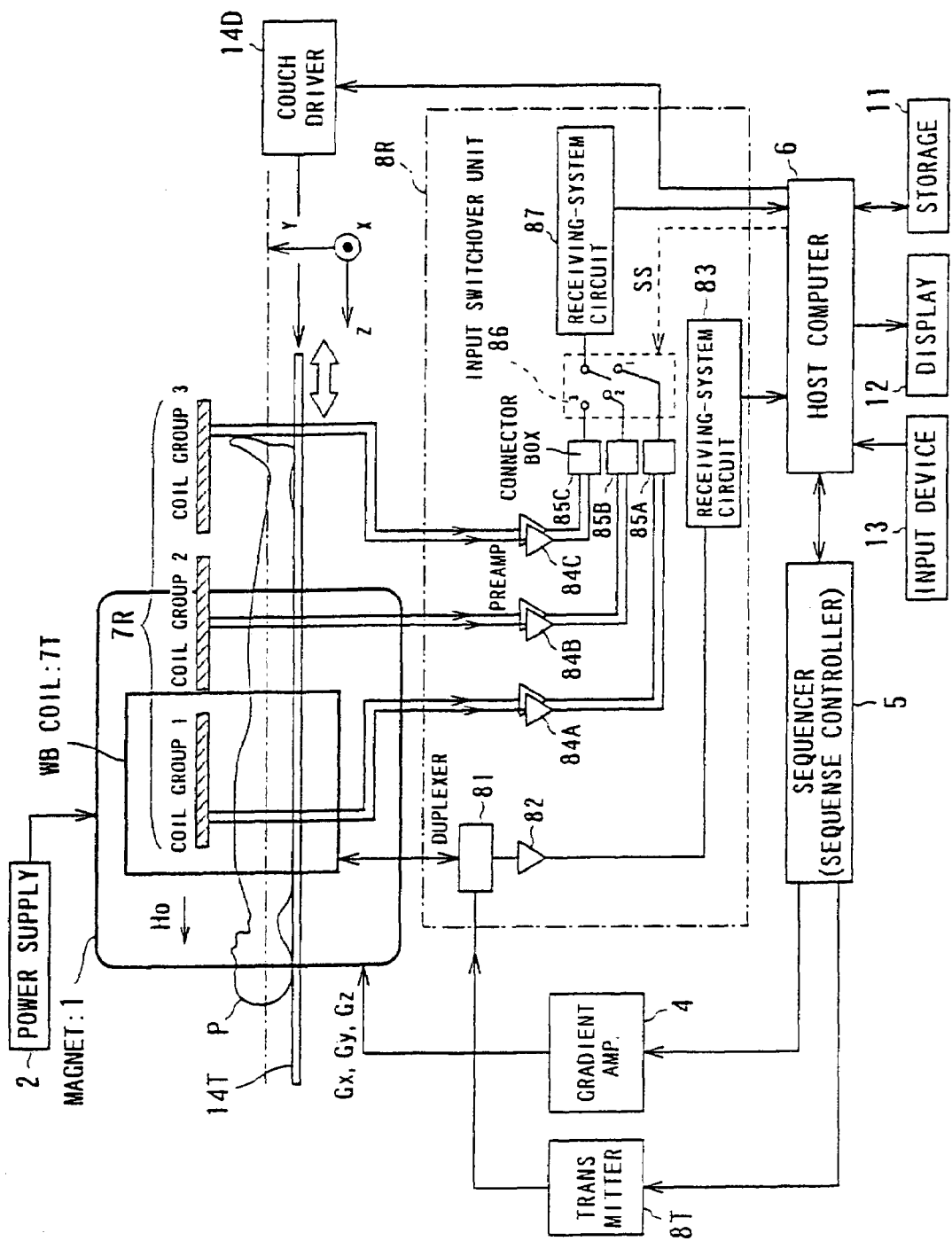
FIG. 3 shows a block diagram outlining the configuration of a magnetic resonance imaging system according to a first embodiment of the present invention, the system being directed to imaging using multiple RF coils on the moving bed technique.
Figure 4:
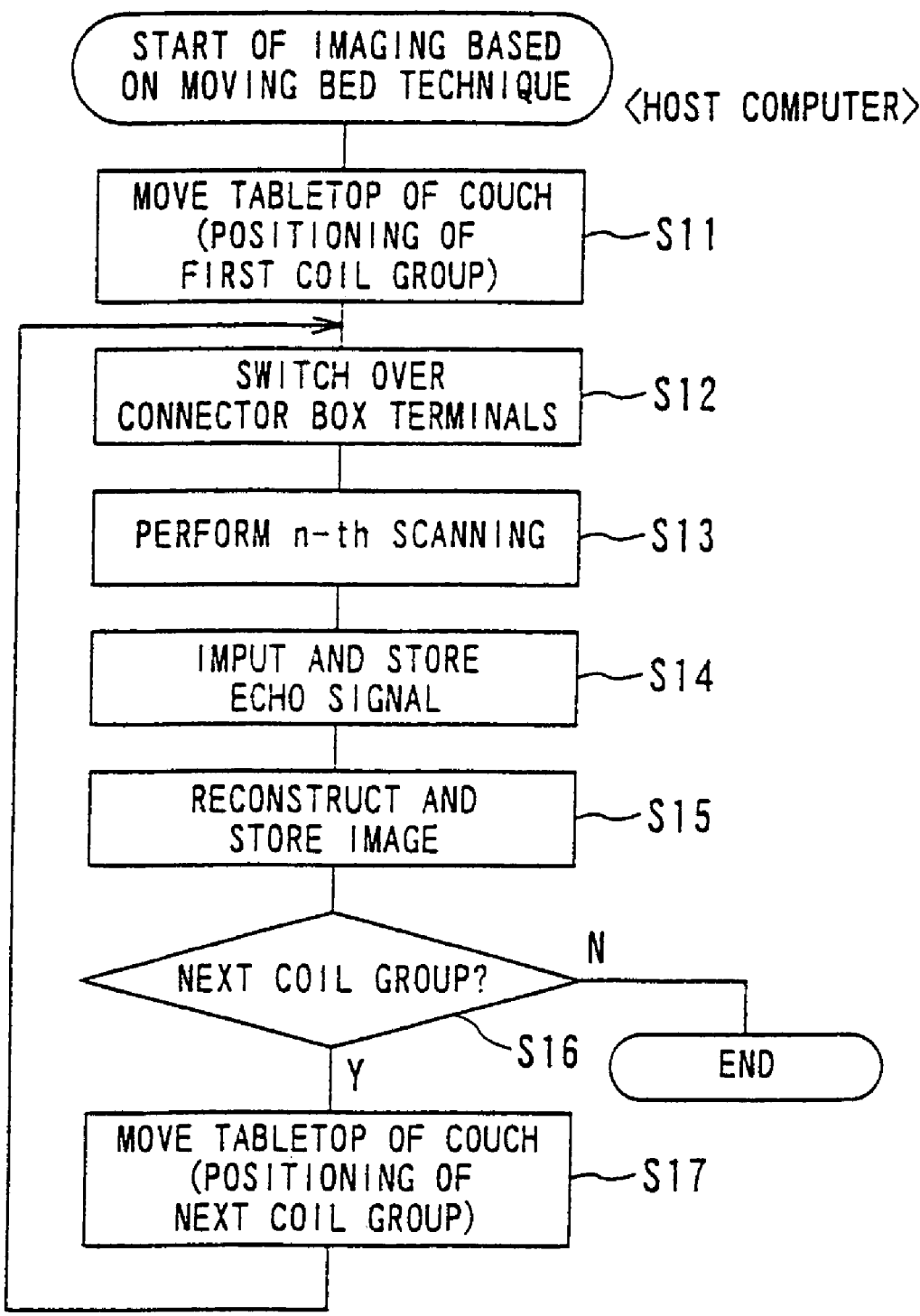
FIG. 4 is a flowchart outlining procedures of imaging performed in the first embodiment on the moving bed technique.

Referring to FIGS. 3 and 4, a magnetic resonance imaging (MRI) system of a first embodiment will now be described.

The magnetic resonance imaging system performs imaging using multiple RF coils with a moving couch (that is, a moving bed technique).

The configuration of this magnetic resonance imaging system is outlined in FIG. 3. This system has a couch unit on which a patient P as an object to be imaged, a static magnetic field generating unit for generating a static magnetic field, and a gradient generating unit for adding position information to the static magnetic field. The system also has a transmission/reception unit for transmitting and reception RF signals and a control/calculation unit in charge of control of the entire system and image reconstruction.

The static magnetic generation unit is proved with a magnet 1 constructed by employing for example a superconducting magnet and a static power supply 2 supplying current to the magnet 1. By these devices, a static magnetic field Ho is produced in an axial direction of a cylindrical bore (a space for diagnosis) into which the object P is inserted. In the orthogonal coordinate axes assigned to the system, such direction agrees with the Z-axis direction. In addition, this generation unit is provided with a shimming coil (not-shown) to which current is supplied from a shimming coil power supply to shim the static magnetic field. This supply of current forms a region in which the static magnetic field is kept to in magnitude within a certain range of uniformity, that is, a region for diagnosis.

The couch unit is configured in such a manner that a tabletop 14T on which the object P is laid can be inserted and returned into and from the bore of the magnet 1. A couch driver 14D does this insertion and return. The couch driver 14D responds to a drive signal given by a host computer 6 later described so as to move the tabletop 14T along its longitudinal direction (i.e., the Z-axis direction). The object P is laid on the tabletop 14T along its longitudinal direction, for example.

The gradient generating unit has a gradient coil unit (not-shown) incorporated in the magnet 1. The gradient coil unit includes three sets (types) of x-, y-, and z-coil for generating X-, Y-, and Z-directional gradient magnetic fields (gradients) orthogonal among themselves. The gradient generating unit further includes a gradient amplifier 4 to supply currents to each of the x-, y-, and z-coils. The amplifier 4 supplies those coils with pulsed currents to generate gradients under the control of a sequencer 5 later described.

Controlling pulsed currents supplied from the gradient amplifier 4 to the x-, y-, and z-coils enables the mutually-orthogonal X-, Y-, and Z-directional gradients, which are gradients in the physical axes, to be synthesized. Thus mutually-orthogonal logic directional gradients, i.e., a slice gradient Gs, phase-encode gradient Ge, and read-out (frequency encoding) gradient Gr can be set or changed in an arbitrary way. The gradients in the slice, phase-encode, and read-out directions are superposed on the static field $H_0$.

The transmission/reception unit includes a whole-body (WB) coil 7T and multiple RF coils 7R, both of which are RF coils, and a transmitter 8T and a receiver 8R both connected to the coils 7T and 7R. The coils 7T and 7R are disposed in the vicinity of the object P in the space for diagnosis formed within the bore of the magnet 1.

The whole-body coil 7T is used in common for transmission and reception in cases when only the coil 7T is employed as the RF coil. By contrast, when employing the multiple RF coils 7R (serving as a reception coil), the whole-body coil 7T is used as a transmission coil.

The multiple RF coils 7R, formed as an array type of coil to which a high S/N (signal to noise) ratio can be given, are disposed in turn in the region in which the static field is uniform (region for diagnosis), so that imaging can be done using the moving bed technique. The multiple RF coils 7R are formed by at least one array coil (each array oil consists of a plurality of coil elements, which are called "coil group" in this embodiment). Each array coil constitutes the coil member according to the present invention. By way of example, the multiple RF coils 7R according to the present embodiment are formed three coil groups 1 to 3 disposed on the tabletop 14T of the couch. Each coil group 1 (to 3) is an array type of coil in which a plurality of coil elements are arranged. The coil groups 1 to 3 can be mounted on the object. The output lines of the three groups 1 to 3 are, separately from each other and coil element by coil element, connected to the host computer 6. Thus the output signal from each coil element is supplied to the host computer 6 independently of each other.

Both the transmitter 8T and the receiver 8R are operative under the control of a sequencer 5 later described. The transmitter 8T supplies to the whole-body coil 7T RF pulsed currents of which frequency is set to a Larmor frequency to cause nuclear magnetic resonance (NMR) at magnetic spins of the object P. On the other hand, the receiver 8R accepts an echo signal (RF signal) received by the whole-body coil 7T or multiple RF coils 7R, then makes it into echo data (i.e., raw data).

Specifically, the receiver 8R is divided, as shown in FIG. 3, into a reception part for the whole-body coil and a further reception part for the multiple RF coils.

The reception part for the whole-body coil includes a duplexer 81 connected with the whole-body coil 7T, a preamplifier 82 connected to the duplexer 81, and a receiving-system circuit 83 receiving a reception signal from the preamplifier 82. The duplexer 81 is coupled with the transmitter 8T as well.

This connection permits the duplexer 81 to pass a transmission drive pulse from the transmitter 8T to the whole-body coil 7T in transmission, while to pass an echo signal detected by the whole-body coil 7T to the preamplifier 82 in reception. The preamplifier 82 pre-amplifies the received echo signal to send the amplified signal to the receiving-system circuit 83. This circuit 83 performs various types of signal processing on the inputted echo signal, the processing including intermediate frequency conversion, phase detection, low-frequency amplification, and filtering. Then, the processed signal is subject to A/D conversion to produce echo data (raw data), before being sent to the host computer 6.

On the other hand, the reception part for the multiple RF coils is provided with preamplifier groups 84A to 84C receiving echo signals form the multiple RF coils 7R every coil group 1 (to 3) and every coil element. The output lines from each preamplifier group 84A (to 84C) are routed to an input switchover unit 86 via each connector box 85A (to 85C) to which the lines can be connected detachably. Connected positions (or a connection order) of the preamplifier groups 84A to 84C to the connector box 85A to 85C are determined in advance.

The input switchover unit 86 is for example composed of a multiplexer and switched over in response to a switchover control signal SS that the host computer 6 gives. Accordingly, the input switchover unit 86 is able to selectively switch over any one of the signals that the preamplifiers 84A to 84C produce and to send out the selected signal through its output terminal. The output terminal of the input switchover unit 86 is then sent to the host computer 6 via a further receiving-system circuit 87. In the similar way to the above, this circuit 87 executes various types of processing, such as intermediate frequency conversion, phase detection, low-frequency amplification, and filtering, on the inputted echo signal. Further, the circuit 87 A/D-converts the processed echo signal to produce echo data, then sends the converted one to the host computer 6.

Moreover, the control/calculation unit includes a sequencer 5 (also called a sequence controller), host computer 6, storage 11, display 12, and input device 13.

The host computer 6 provides the sequencer 5 with pulse sequence information on the basis of procedures on software stored in its inner memory or the storage 11 and controls the operations of the entire system. Additionally, the host computer 6 has various functions of calculating image data through reconstruction processing of echo data and controlling the drive of the couch driver 14D. The host computer 6 further includes a function of selectively switching over the input switchover unit 86 by giving a switchover control signal SS thereto every time when, of a plurality of times of imaging, one imaging are switched over to another. This switchover function is previously determined by the software procedures so that the input/output paths of the input switchover unit 86 are switched over in a predetermined order.

The imaging scan is carried out on the imaging pulse information in order to acquire a set of echo data necessary for image reconstruction. The pulse sequence uses either a three-dimensional (3D) scan or a two-dimensional (2D) scan. As modes of trains of pulses which can be employed, provided are an SE (spin echo) method, FSE (fast spin echo) method, FASE (fast asymmetric SE) method (that is, the FSE method combined with a half-Fourier method), EPI (echo planar imaging) imaging, FE (gradient field echo) method, FFE (fast FE) method, segmented FFE method, and others.

The sequencer 5 has a CPU and memories and memorizes pulse sequence information sent from the host computer 6. Based on this information, the sequencer 5 controls the operations of the gradient amplifier 4, transmitter 8T, and receiver 8R. The pulse sequence information is all kinds of information necessary for operating the gradient amplifier 4, transmitter 8T, and receiver 8R according to a series of pulse sequence. For instance, the pulse sequence information includes pieces of information concerning magnitudes of pulsed currents applied to the x-, y-, and z-coil, duration of application of the pulses, and application timing.

Echo data (original data or raw data) processed by the receiver 8R are sent to the host computer 6, which has a function of image reconstruction on the basis of a predetermined calculation program. Therefore, the host computer 6 uses its calculation function to map echo data given by the receiver 8R in a Fourier space (referred to as a k-space or frequency space) formed by its inner memory. The host computer 6 carries out a two- or three-dimensional Fourier transform on each set of echo data, so that image data in the real space are reconstructed. The image data are then subjected to a display action conducted by the display 12 as well as stored by the storage 11. Imaging conditions, the type of a pulse sequence, and information with regard to image synthesis or subtraction are provided to the host computer 6 via the input put 13 depending on operator's desire.

Though not shown, the storage 11 has a memory (serving as a recording medium) in which stored is a program for MR imaging based on the fast imaging technique involving both the moving bed technique and couch movement, which are derived from the present invention. The host computer 6 reads in the program when the system is activated, and is used to perform the MR imaging.

In this magnetic resonance imaging, imaging that uses the moving bed technique is carried out, as shown in FIG. 4. The host computer 6 commands the processing shown in FIG. 4.

At first, the tabletop 14T is moved such that the center of the first coil group 1 in the Z-axial direction agrees with the center of the uniform region of the static field in the Z-axial direction (Step S11 in FIG. 4). Responsively to this location, the host computer 6 provides the input switchover unit 86 with the switchover control signal SS, so that its input-side switchover terminal is switched over to "1," that is, the side of the connector box 85A (i.e., the preamplifier 84A) (Step S12 in FIG. 14).

At this tabletop position and this switch's switchover position, the first scan is performed based on pulse sequence information given by the sequencer 5 (Step S13 in FIG. 4). This scan allows all echo signals acquired from the all the coil groups 1 to 3 via the multiple RF coils 7R to be sent to the receiver 8R. However, since the input path of the input switchover unit 86 in the receiver 8R is switched over to only the side of the coil group 1, an echo signal acquired by the coil group 1 is solely sent to the receiving-system circuit 87.

Thus the echo signal detected by the coil group 1 is received and processed by the receiving-system circuit 87, with the result that the echo signal is converted to echo data, then sent to the host computer 6. In other words, of the echo signals detected by the all the coil groups 1 to 3, only an echo signal emanated from any coil group present in the uniform region of the static field is processed and sent to the host computer 6 (Step S14 in FIG. 4).

The host computer 6 performs reconstruction processing of echo data corresponding to the echo signal detected by the coil group 1 (Step S15 in FIG. 4). Real-space image data of a slice or slab of the object P are thus obtained, and temporarily stored in its inner memory of the host computer 6 or the storage 11.

Then, in order to cope with the second scan, the tabletop 14T of the couch (i.e., the object P) is moved by a distance corresponding to a region required for one time of imaging in the Z-axis direction (Step S16 in FIG. 4). Thus the second coil group 2 is located in the central part of the uniform region of the static field in the Z-axis direction. Namely, in cases all the coil groups 1 to 3 is the same in size, an amount of movement of the tabletop in the Z-axis direction is the same whenever each time of imaging is carried out. Responsively to this positioning, the host computer 6 sends the switchover control signal SS to the input switchover unit 86 in order to switch over its input-side switchover terminal to "2," i.e., the side of the connector box 85B (corresponding to the preamplifier group 84B) (Step S12 in FIG. 4). At this positioning and under this input switchover state, the second scan is carried out in the same way as the above (Step S13 in FIG. 4). As a result, only an echo signal detected by the second coil group 2 is received and processed by the receiving-system circuit 87, the resultant echo data being given to the host computer 6. By this host computer 6, the echo data are reconstructed to image data (Steps S13 to S15 in FIG. 4).

In the similar manner to the above, the tabletop 14T is further moved in the Z-axis direction by a distance corresponding to the region required for one time of imaging. In parallel with this, the input-side switchover terminal of the input switchover unit 86 is switched over "3," (that is, the preamplifier 84C). In this situation, the third scan is carried out in the similar manner to the above (Steps S16, S17, S12 and S13 in FIG. 4). Accordingly, only an echo signal detected by the third coil group 3 is received and processed by the receiving-system circuit 87, thereby resultant echo data being sent to the host computer 6. The echo data are reconstructed into image data by the host computer 6 (Steps S14 and S15 in FIG. 4).

In this way, the multiple RF coil 7R is used as a reception RF coil to perform each time of scan based on the moving bed technique. After the acquisition of echo data, the host computer 6 synthesizes a plurality of images that have been reconstructed in response to echo signal detection using each coil group 1 (to 3) into an entire image with their positions in the X-axis direction made to agree with each other. This produces, for example, a coronal image that covers the entire inferior limb.

Therefore, in the magnetic resonance imaging system according to the present invention, the single receiving-system circuit is enough even when a plurality of coil groups 1 to 3 constituting the multiple RF coil 7R. It is therefore possible to reduce the number of receiving-system circuits that conventional. Particularly, the capacity of a memory buffer incorporated in the receiving-system circuit can largely be lowered in number. Further, because it is not necessary for an operator to manually set a tabletop's position with the position observed by the operator, the operation is simplified greatly and the tabletop can be located at a desired position with precision. In addition, this way of automatic tabletop movement enables the imaging to speed up.

Figure 1:
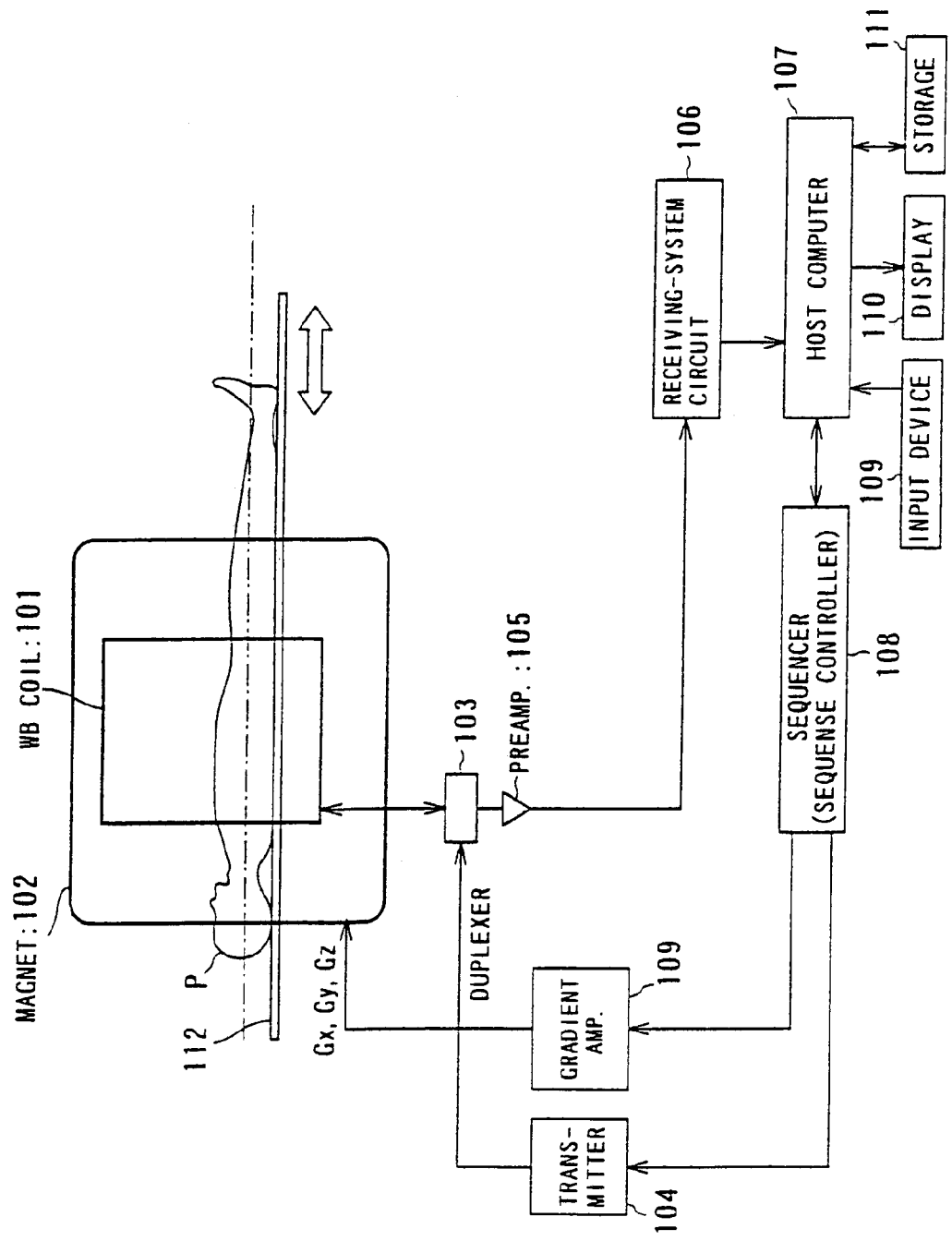
FIG. 1 is a block diagram of a conventional magnetic resonance imaging system for imaging carried out using a whole-body coil on a moving bed technique.
Figure 2:
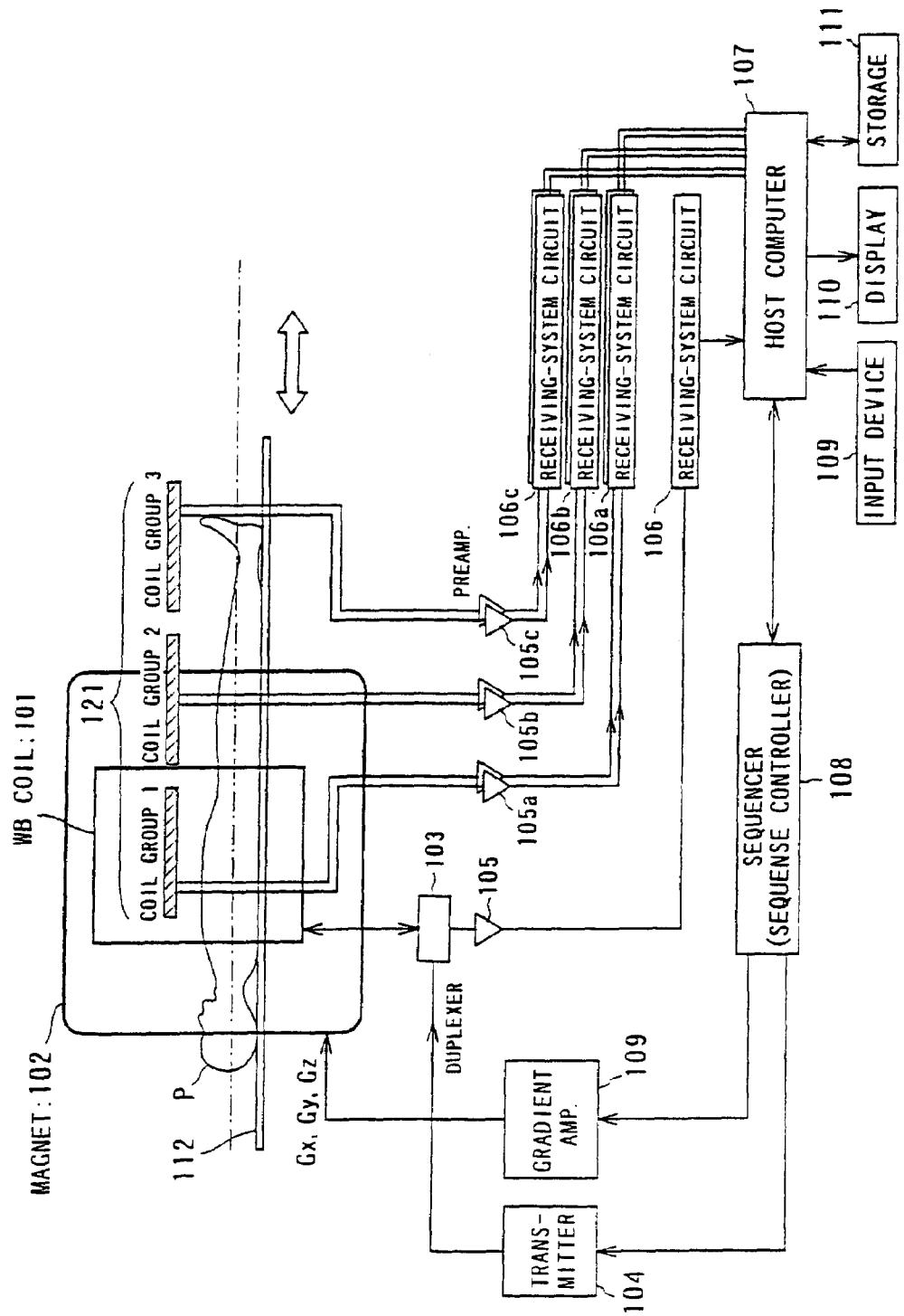
FIG. 2 is a block diagram of a conventional magnetic resonance imaging system for imaging carried out using multiple RF coils on the moving bed technique.

On the contrary, in the conventional construction shown in FIG. 2, all echo signals detected by all the coil groups of the multiple RF coil are sent to the host computer via the individual receiving-system circuits. This configuration will still do if the number of coil groups is less, but if each coil group adopts a large number of coil elements, the number of receiving-system circuits increases correspondingly to that of coil elements. The capacities of buffer memories temporarily storing A/D-converted echo data should be extremely large. For instance, if three coil groups are used, each coil group (array coil) consisting of four-channel array types of coil elements, a total of 12-channel receiving-system circuits are required. By contrast, it is enough for the receiver 8R according to the present embodiment to use only one receiving-system circuit, expecting that preamplifiers are prepared for each coil element of each coil group and one input switchover unit is prepared. The largeness of the circuit is lowered to a grater degree.

Figure 5:
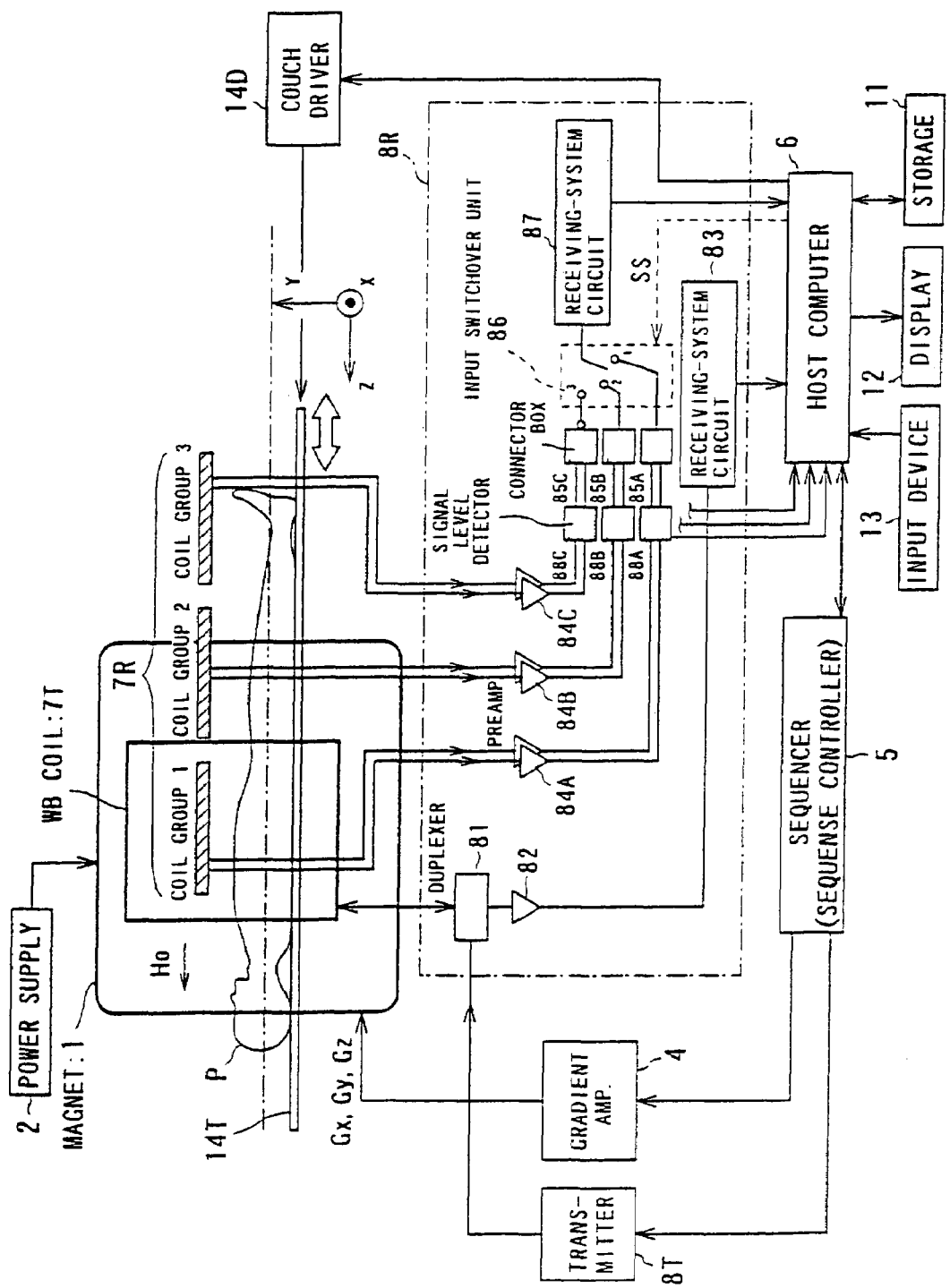
FIG. 5 shows a block diagram outlining the configuration of a magnetic resonance imaging system according to a second embodiment of the present invention, the system performing imaging using multiple RF coils on the moving bed technique.

Referring to FIG. 5, another embodiment of the present invention will now be explained. This embodiment includes the feature that the foregoing input switchover unit 86 operates to switch over according to levels of echo signals.

In a magnetic resonance imaging system shown in FIG. 5, the reception part for the multiple RF coil in the receiver 8R employs signal level detectors 88A to 88C. Each of the detectors is inserted, coil group by coil group, between each of the connector boxes 85A to 85C and each the preamplifier groups 84A to 84C. Each signal level detector 88A (to 88C) detects levels (amounts of power) of echo signals emanated from each coil group 1 (to 3). Detected signals SC from those detectors 88A to 88C are sent to the host computer 6.

The multiple RF coils 7R are entirely moved step by step along the Z-axis direction every each time of imaging. Accordingly, the coil groups 1 to 3 enters the uniform region of the static field in a certain direction in turn and go out of the region in the opposite direction in turn. Hence an echo signal from a certain coil group existing in the uniform region is higher in intensity than that from the remaining coil groups that are not present in the uniform region. The host computer 6 accepts the detected signals SC form the signal level detectors 88A to 88C to determine their signal levels. Specifically, a certain coil group that provides the highest signal level is selected. The host computer 6 then provides the input switchover unit 86 with the switchover control signal SS so as to switch over the input switchover unit 86 in such a manner that the echo signal from the selected coil group is sent to the receiving-system circuit 87.

The remaining configuration and imaging manners using the moving bed technique are identical to those in the first embodiment.

As described above, the reception path is automatically switched over based on the levels of the signals from the coil groups 1 to 3. Accordingly, like the foregoing embodiment, the single receiving-system circuit is enough to the multiple RF coil 7R. The configuration of the system can be simplified and compacted to a larger extent.

It is unnecessary to set an amount of movement of the couch for every time of imaging. Also it is unnecessary to know information about when each coil group was present in the uniform region of the static field (the region for diagnosis). Even when the lengths of the coil groups 1 to 3 in the Z-axis direction are different from each other and/or the coil groups are disposed to be oblique to the Z-axis direction, such automatic switchovers can be done, thus substantially saving labor for operations.

In addition, in the magnetic resonance imaging system of this embodiment, an alternative control is possible. That is, the movement of the tabletop 14T can be controlled using echo signal levels detected when each coil group 1 (to 3) existed in the uniform region of the static field with the Z-axis directional center of each coil group placed at the center of the region. Practically, as the sequencer 5 executes a positioning scan periodically, the host computer 6 controls the Z-axis directional movement of the tabletop 14T. Until the detected signals from the signal level detectors 88A to 88C reach a predetermined signal level, the tabletop 14T (that is, the multiple RF coils 7R), which is located at its predetermined initial position, is moved every time of imaging. This allows the tabletop 14T to be moved in an automatic function.

This automation makes it possible that the tabletop 14T is moved in a controlled manner independently of the Z-axis directional sizes of the coil groups or arranged situations of the coil groups. For example, such cases include a situation that the coil groups 1 to 3 that compose the multiple RF coil 7R are made into different sizes that agree with each part of an object, respectively, thus the Z-axis directional sizes of the coil groups being different from each other. Further included is a situation that the Z-axis directional sizes of all the coil groups are equal to each other, but each coil is not necessarily disposed in position in the Z-axis direction. That is, even if the coil groups are mutually different in the Z-axis directional substantial or apparent sizes, each coil group can be located in turn in the center of the uniform static field region in the Z-axis direction every time of imaging. This automatic control of the tabletop reduces operator's operations drastically.

Figure 6:
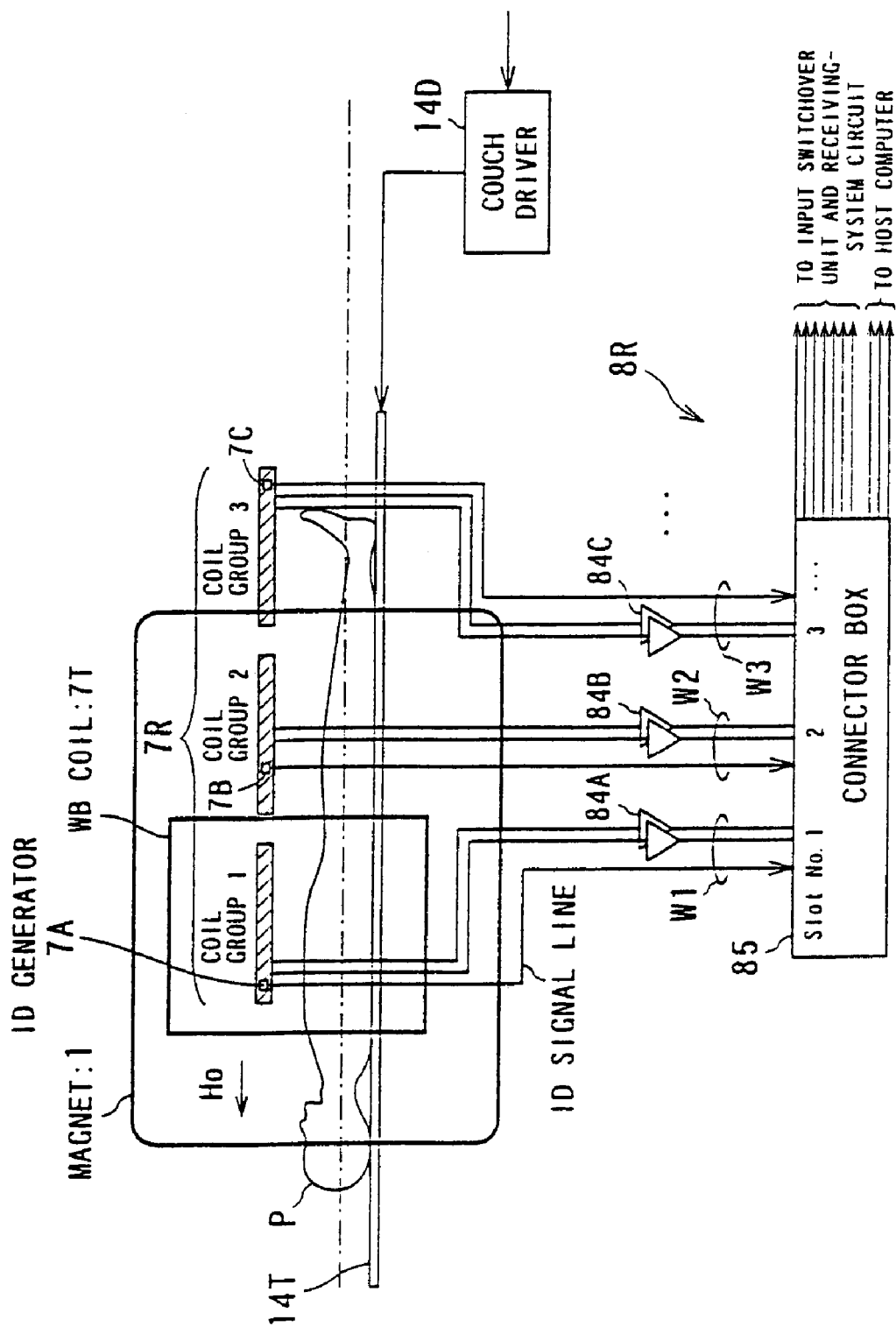
FIG. 6 shows a block diagram outlining part of the configuration of a magnetic resonance imaging system according to a third embodiment of the present invention, the system performing imaging using multiple RF coils on the moving bed technique.
Figures 7, 8:
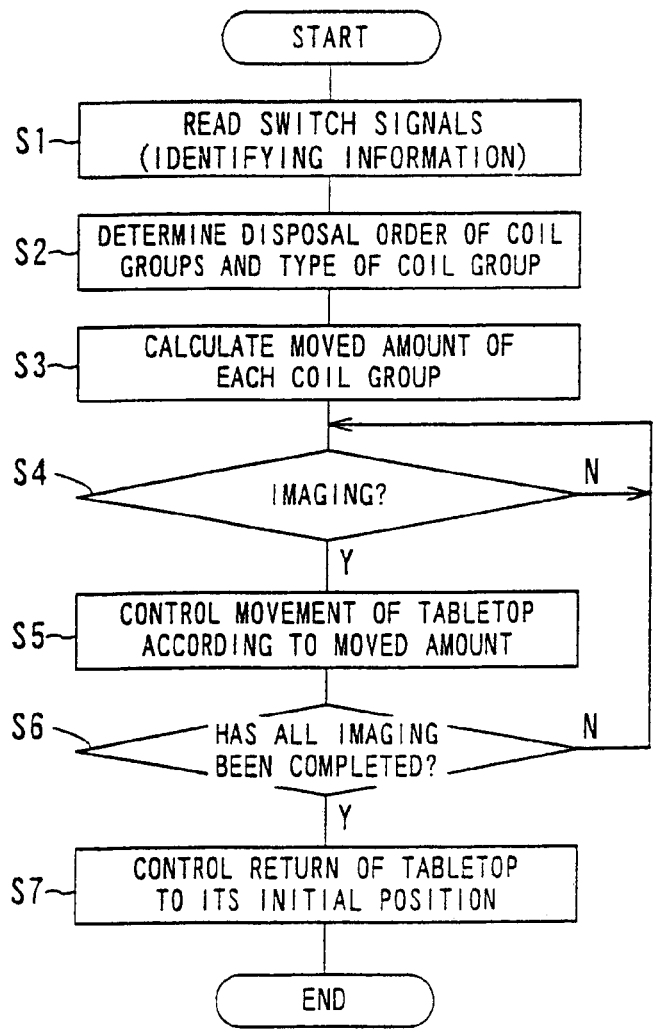
FIG. 7 illustrates the relationship between the switch positions of an ID generator and pieces of coil information.
FIG. 8 is a flowchart outlining tabletop movement control based on information given by the ID generator.

Referring to FIGS. 6 to 8, a further embodiment of the present invention will now be described. This embodiment relates to another example to detect the positions of coil groups that composes a multiple RF coil.

FIG. 6 shows an essential part of a receiver 8R of a magnetic resonance imaging system according to this embodiment. As shown therein, an ID generators 7A to 7C are placed in a plurality of coil groups 1 to 3 that composes a multiple RF coil 7R, respectively. Each of the ID generators 7A to 7C is for example a two-bit dip switch. The dip switch is not always limited to 2 bits. As shown in FIG. 7, each dip switch generates identifying information indicative of the type and coil size of each coil group depending on its switched positions. The type of coil group includes a surface coil, QD coil, while the size of coil group includes the largeness of length in the Z-axis direction. The relationships between the switched positions and the identifying information for each coil group are previously stored as tables in an inner memory of the host computer 6.

As each coil group (consisting of a plurality of coil elements disposed in an array), coil elements of a desired type and a size are selected appropriately, then disposed along the Z-axis direction, that is, along an object P or the tabletop 14T. A plurality of disposed coil groups 1 to 3 compose a multiple RF coil 7R. For instance, if a region to be imaged is the inferior limb, the coil groups of appropriate types and sizes are selected according to the shape and size of each part of the inferior limb. It is not absolutely necessary to dispose the coil groups along the geometrical Z-axis. By way of example, a certain coil group may be disposed along the femur part, thus slight oblique to the Z-axis direction.

The plurality of coil groups 1 to 3 disposed as above are connected to slots 1 to 3 of a connector box 85 in the order of the disposition. For example, the wires W1 of the first coil group 1 which is to be located nearest to the patient's head are connected to the first slot 1, the wires W1 including a signal line from the ID generator 7A and signal lines from the coil elements. The second and third coil groups 2 and 3 are connected in the similar way, so that their wires W2 and W3 are connected to the slots 2 and 3 in turn. In this way, the coil groups 1 to 3 can simply be connected to the slots 1 to 3 of the connector box 85 in the disposed order of the coil groups, independently of types and sizes of the coil groups 1 to 3.

Of the output signal terminals of the connector box 85, the signal lines responsible for outputs of the coil groups 1 to 3 are routed to the receiving-system circuit 87 via the input switchover unit 86, as shown in FIG. 5. Meanwhile, the signal lines responsible for outputs of the ID generators 7A to 7C are coupled with the host computer 6.

The host computer 6 executes control represented in FIG. 8 using the switch signals from the ID generators 7A to 7C, in other words, identifying information of the coil groups. Specifically, the host computer 6 reads the switch signals, then makes reference to the previously-stored table exemplified in FIG. 7 to determine a disposal order of the coil groups 1 to 3 and the type of each coil group (Step S1 and S2). The host computer 6 obtains the sizes of the coil groups through, for example, making reference to the table and amounts of movement of the coil groups 1 to 3 that should be moved for each time of imaging are calculated based on the obtained sizes (Step S3).

On completion of this preparation, the host computer 6 begins to wait for the next action as it determines whether timing for imaging has come or not (Step S4). During the waiting, if imaging timing is detected, the host computer controls a not-shown couch driver so that the tabletop 14T is moved by a distance corresponding to the first movement amount (Step S5). Then, it is determined whether or not all the imaging has completed or not, and if imaging remains, the processing at Steps S4 and S5 will be repeated (Step S6). This repetition leads to the second and third imaging that also involves the movement of the multiple RF coil 7R (that is, the coil groups 1 to 3). After the completion of all the times of imaging, the tabletop 14T is controlled such that it returns to its initial position predetermined in the Z-axis direction (Step S7).

In this embodiment, it is therefore unnecessary for an operator to pay a particular attention to the relationship between types and sizes of the coil groups to be used and movement amounts on the moving bed technique. Identifying information provided by the ID generators 7A to 7C can be used to automatically calculate movement amounts of the tabletop 14T. Thus, the tabletop movement is automatically controlled, during which time the input switchover unit 86 is automatically switched over in response to each time of imaging. Accordingly, an echo signal detected by only a certain coil group 1 (to 3) located in the uniform static field region is received for imaging.

Based on the moving bed technique involving the multiple RF coil 7R, an MR image can therefore be obtained over a wired area. Concurrently, a great deal of labor can be saved for operator's operations.

Figure 9:
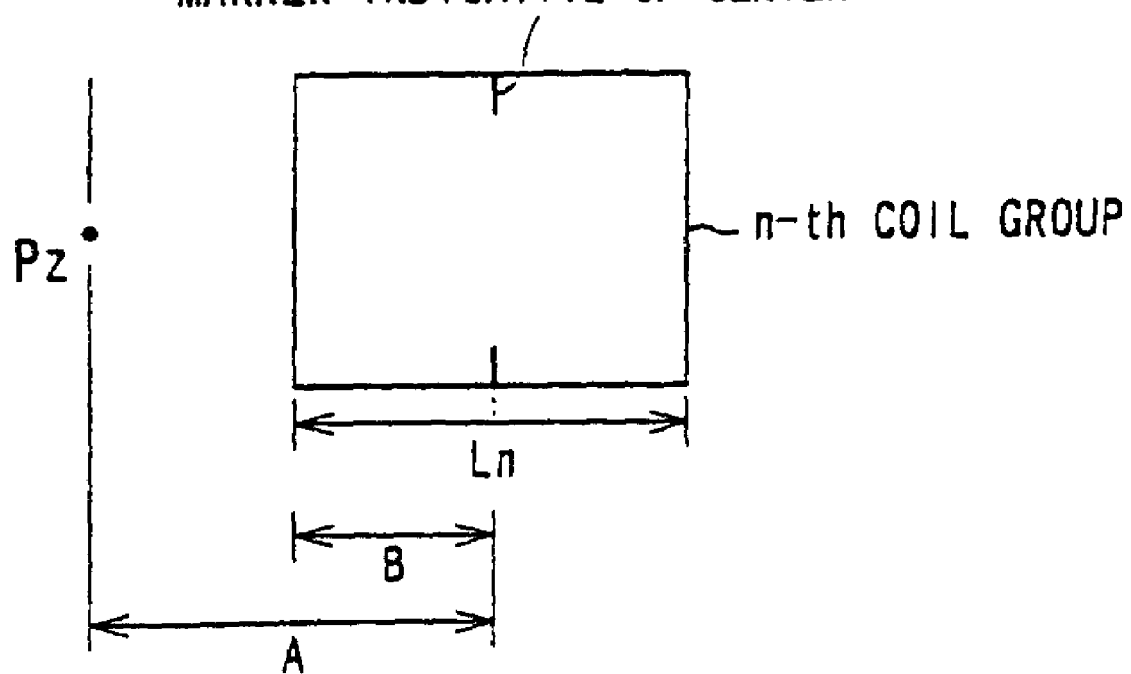
FIG. 9 illustrates markers used for recognizing the position of a coil element, which shows a modification.

A modified example from the above will now be described with reference to FIG. 9. This example, applicable to the foregoing embodiment, relates to a technique of determining accurate amounts of movement of the tabletop (that is, the multiple RF coil) from positioning information toward the first coil group.

A marker MK showing the central position of each coil group 1 (to 3) in the Z-axis direction is put on the coil groups. At first, a light projector is spotlighted onto the marker MK to assign the central position of each coil group to predetermined positions of a couch's positional encoder. Then the light projector is used to locate its spotlighted position Pz to a desired region to be diagnosed of a patient, before the position Pz is memorized. A coil size Ln is found from the identifying information of each coil group. Subtracting a length A between the spotlighted position Pz and the coil center from half of the coil size Ln gives the residual length from the current position Pz to the first coil group with precision. Accordingly, the coil groups can be disposed at any position on the couch. Even when the central position of each coil group is not always consistent with an actually spotlighted position, the tabletop can be moved with precision.

A further modification will now be described, which is also applicable to the foregoing embodiment. This modification provides another configuration to detect the position of each coil group. To be specific, a minute pickup coil is disposed at the center of each of a plurality of coil groups. With the coil groups shifted by a predetermined distance from the center of the uniform static field region, a measuring gradient pulse of a predetermined magnitude is given to the coil groups. This previously provides the relationships between the known shifted distance and output signal values of the pickup coils. The output signal values can be given as waveform height values of output waveforms calculated using an integrator. In imaging, in cases the positions of the coil groups are desired, the measuring gradient pulse is applied to the pickup coils to detect output signals therefrom, thus providing the Z-axis directional positions of the coil groups. Imaging on the moving bed technique with the pickup coils requires that the pickup coils be able to detect the Z-axis direction gradient pulse.

Further, where the multiple RF coil is made up of a plurality of coil groups, such as surface coils, to which attention must be paid with regard to problem of a spatial disposal, a pickup coil for the orthogonal three directions is attached to a support of each coil group. In this case, the measuring gradient pulse is applied in sequence in the three directions. Using the previously obtained positional relationship between each coil center and its support, output signals of the pickup coils are corrected.

Figure 10:
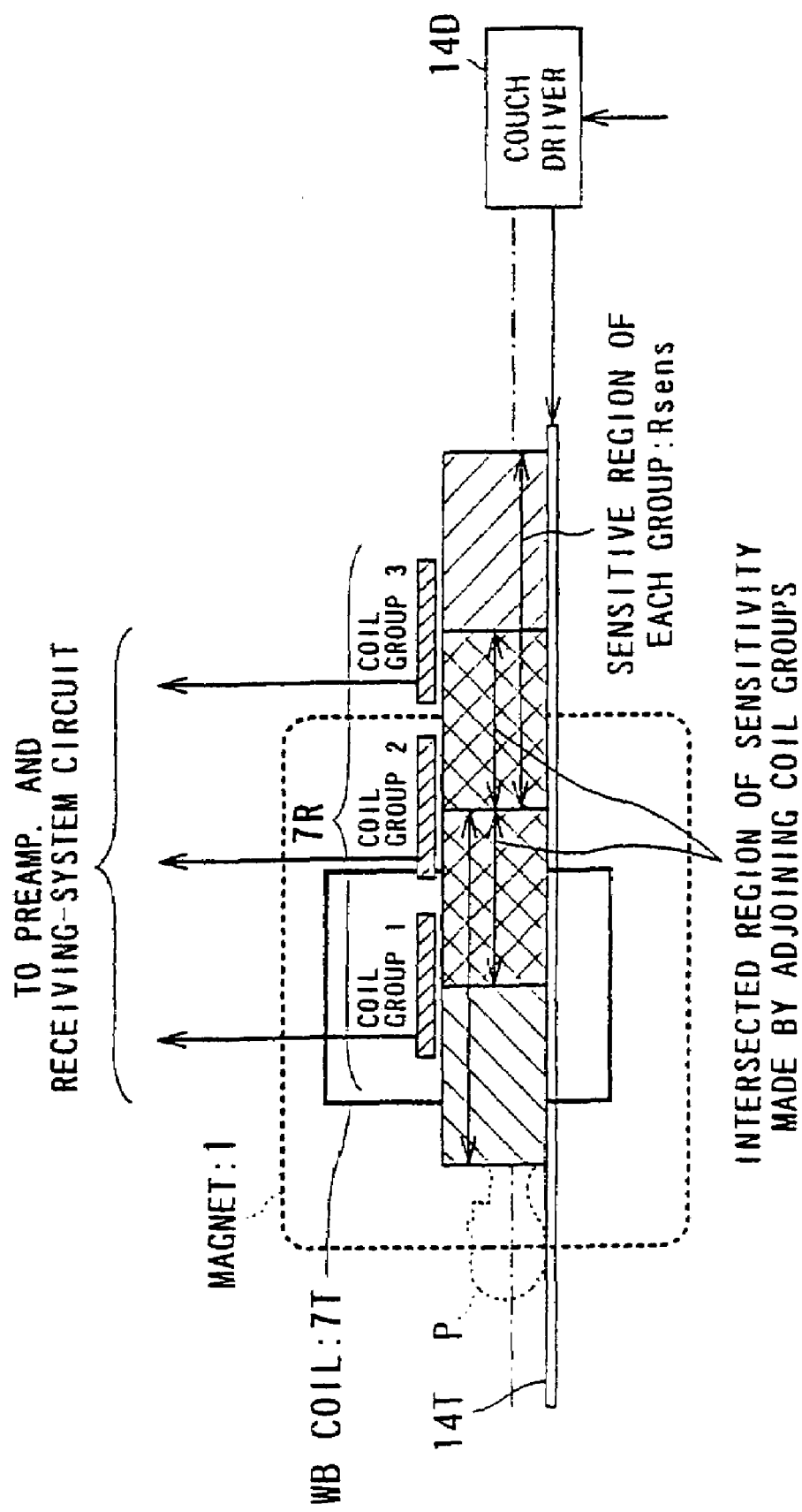
FIG. 10 is an outlined schematic diagram showing part of a magnetic resonance imaging system according to a fourth embodiment of the present invention, the system performing fast imaging using multiple RF coils with a couch moved.

Referring to FIG. 10, another embodiment of the present invention will now be described. This embodiment concerns fast imaging using a multiple RF coil on the basis of the moving bed technique.

FIG. 10 pictorially shows the positional relationship between a multiple RF coil 7R and sensitivity regions of coil groups thereof in a magnetic resonance imaging system according to the present embodiment. As shown, the coil groups 1 to 3 of the multiple RF coil 7R are disposed along the Z-axis direction. Responsively to the movement of the tabletop 14T, the three coil groups 1 to 3 are also moved in the Z-axis direction.

Echo signals detected by the coil groups 1 to 3 are sent to a receiver of which circuitry is constructed in the same way as that in any of the first to third embodiments, in which the signals are processed by any of the foregoing processing ways. In this case, the foregoing input switchover unit is designed so that it allows two adjoining coil groups to simultaneously be coupled with the receiving-system circuit. The receiving-system circuit includes a set of circuits to process, coil element by coil element, the two echo signals emanated from the two coil groups. This makes it possible that the two echo signals are received and processed in parallel, before being sent, signal by signal, to a host computer as echo data.

Commands issued from the host computer or sequencer permits the tabletop 14T to move along the Z-axis direction. Each of the coil groups 1 to 3 is located in the uniform static field region (the region for diagnosis) every time of imaging, but in the present embodiment, there is no need to locate the center of a sensitivity region $R_{sens}$ of each coil group at the center of the uniform static field region (not shown), differently from the ordinal moving bed technique. Instead, a region $R_{overlap}$ in which sensitivity distribution regions $R_{sens}$ of two adjoining coil groups are mutually overlapped is set in the uniform static field region in order to perform imaging.

One time of scan is carried out with half of the number of steps of encoding necessary for reconstructing a single image. When each time of scan is ended, the couch is moved for the next scan by a distance for one time of scan, the distance being able to be scanned by one coil group. This combination of the scan and the couch movement is repeated to scan an entire region to be desired.

More practically, this imaging can be carried out based on a conventional known technique of fast imaging using a multiple RF coil. Such technique has been provided by, for example, "$10^{th}$, Ann. Scientific Meeting SMRM. 1240, 1991." Reducing the number of encoding steps than that necessary for a signal image will result in an image with aliasing. But the above processing technique includes calculation to remove the aliasing. In other words, the fact that the coil sensitivity distributions of the coil groups are different from each other is utilized to decompose the aliasing through post-calculation, then the aliasing is removed from the image.

Accordingly, the present embodiment enables the fast imaging to be performed using the moving bed technique. In particular, through the multiple RF coil is used, a plurality of sets of coil elements that composes the multiple RF coil are automatically moved (tabletop movement) and positioned, in addition to automatic switchovers between the coil sets. Therefore, all the advantages of the fast imaging can be provided, with fewer operators burden on operations.

In cases, as described above, the fast imaging with the multiple RF coil is conducted under the moving bed technique, the number of encoding steps can be lowered in inverse proportion to the number of coil groups (elements). Thus, imaging time is reduced and a fully high speed of imaging is maintained.

Figures 11A, 11B:
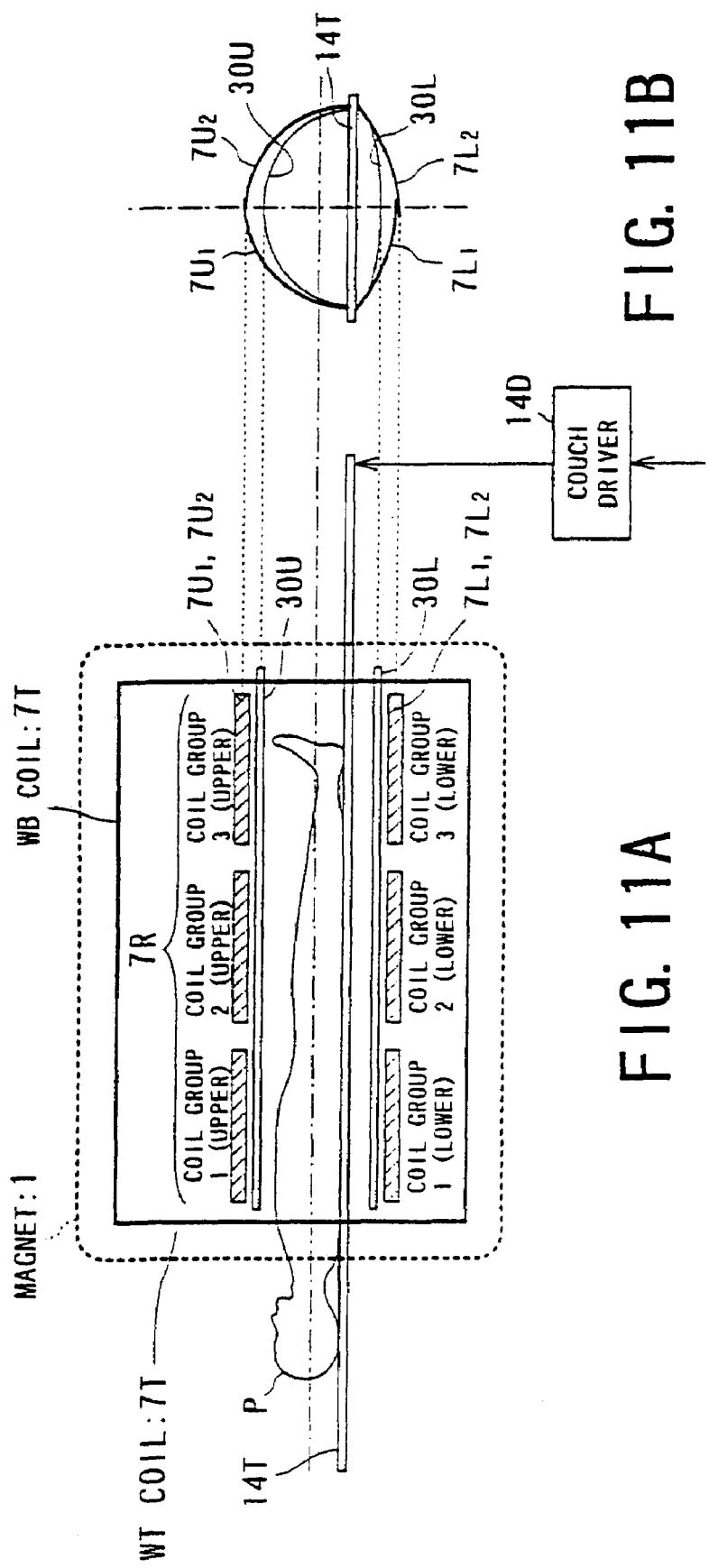
FIGS. 11A and 11B are outlined schematic diagrams each showing part of a magnetic resonance imaging system according to a fifth embodiment of the present invention, the system performing fast imaging using multiple RF coils with a couch moved.

Referring to FIGS. 11A and 11B, another embodiment of the present invention will now be described. This embodiment relates to the disposal of a multiple RF coil.

As shown in FIGS. 11A and 11B, a multiple RF coil of this embodiment is disposed as far apart as possible from the tabletop 14T of a couch or the surface of an object P. Specifically, the multiple RF coil 7R consists of three coil groups 1 to 3. Each coil group 1 (to 3) consists of an array type of upper coil group 1 (to 3) and an array type of lower coil group 1 (to 3). The upper coil group 1 (to 3) has two coil elements $7U_1$ and $7U_2$ located above the upper side of the tabletop and supported by a common coil supporter 30U. The lower coil group 1 (to 3) has two coil elements $7L_1$ and $7L_2$ located below the lower side of the tabletop and supported by a common coil supporter 30L.

Compared to the multiple RF coil shown in FIG. 10, this disposal widens the sensitivity distribution region $R_{sens}$ of each coil group, thus widening an overlapped region $R_{overlap}$ of the sensitivity distribution regions between adjoining coil groups. If a region to be imaged is the same in area, the above disposal allows imaging to be accomplished with a less number of coil groups.

Figure 12:
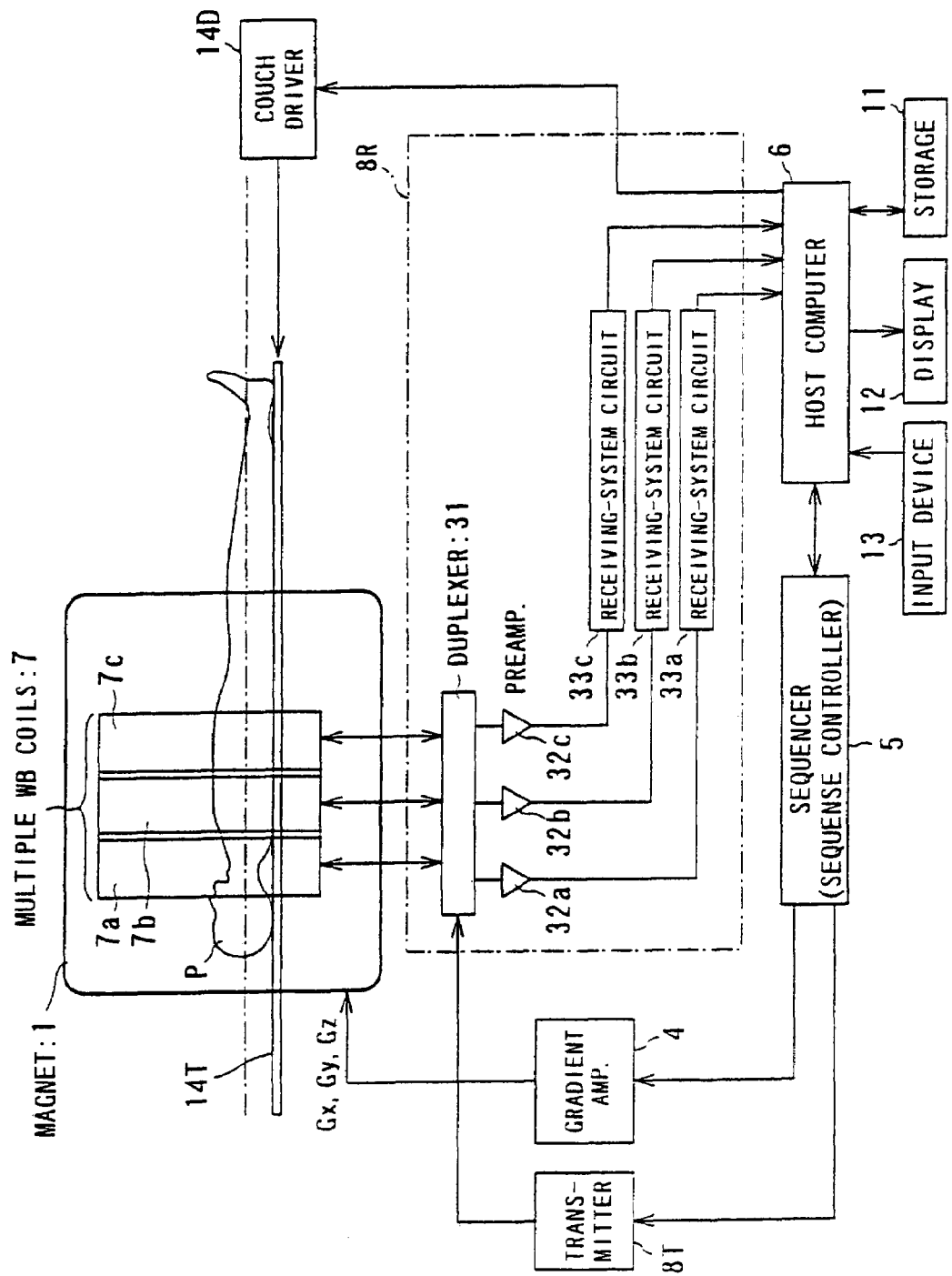
FIG. 12 is an outlined schematic diagram showing part of a magnetic resonance imaging system according to a sixth embodiment of the present invention, the system performing fast imaging using multiple whole-body coils with a couch moved.

Referring to FIG. 12, another embodiment of the present invention will now be described. This embodiment is concerned with a configuration that employs a whole-body (WB) coil as multiple RF coils.

As shown FIG. 12, there is a whole-body coil 7 composed of an array of multiple coils, which are configured by placing three short-axis whole-body coils 7a, 7b and 7c in an array. The number of disposed coils is at least two. The whole-body coils 7a, 7b and 7c compose the coil members of the present invention. The respective whole-body coils 7a, 7b and 7c are routed, in a receiver 8R, to respective preamplifiers 32a, 32b and 32c via a duplexer 31. The preamplifiers 32a, 32b and 32c are connected to a host computer 6 by way of receiving-system circuits 33a, 33b and 33c. These configuration enable echo signals detected by the whole-body coils 7a, 7b and 7c to be received and processed independently of each other. The transmitter 8T is coupled with the whole-body coils 7a, 7b and 7c via the duplexer 31, so that transmission can be done.

Figures 13A, 13B:
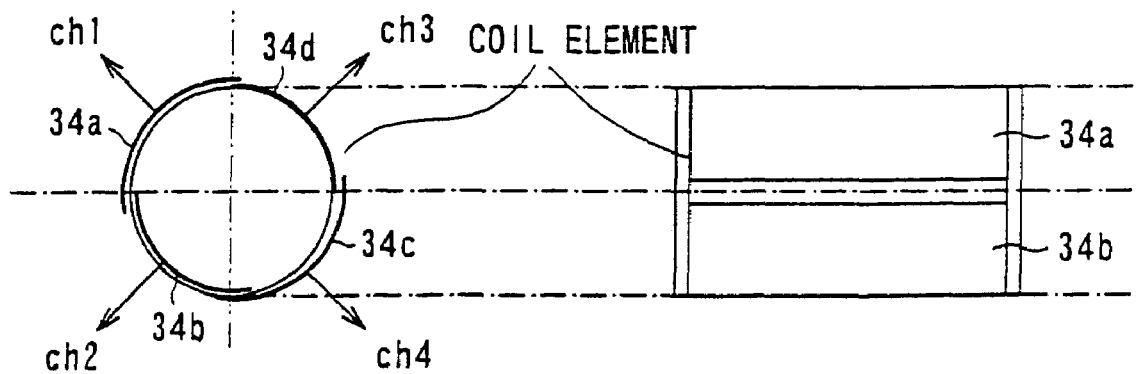
FIGS. 13A and 13B illustrate the configuration of multiple whole-body coils according to a modification.

Alternatively, the multiple whole-body coils can be made into a configuration shown in FIGS. 13A and 13B. A practical configuration is such that four-channel whole-body coils 34a, 34b, 34c and 34d are disposed around a bobbin, thus the coils being multiple. In this configuration, if the sensitivity distributions are symmetric, some cases are brought to impossible reconstruction. The coils are made asymmetric in disposal in the lateral and longitudinal directions.

Figure 14:
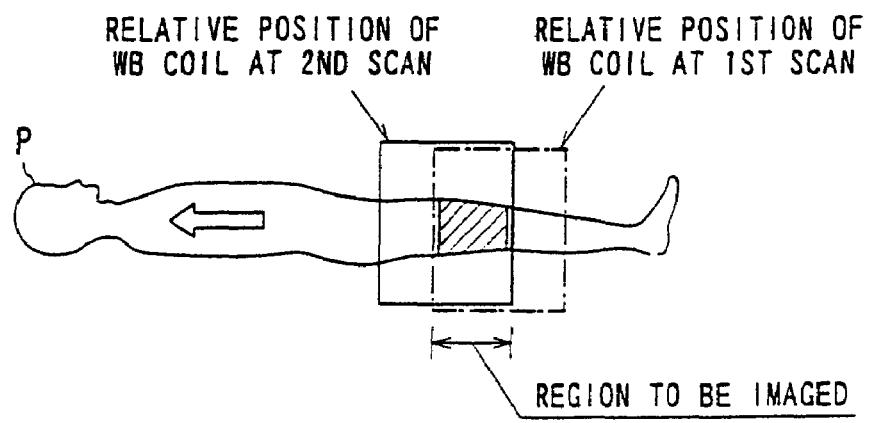
FIG. 14 is an illustration of coil positions and a region to be imaged realized by fast imaging according to a seventh embodiment of the present invention, the imaging being performed using a single whole-body coil with a couch moved.

Referring to FIG. 14, another embodiment of the present invention will now be described. This embodiment relates to a system in which fast imaging that involves couch movement is performed using a single whole-body coil.

The fast imaging described by the foregoing paper requires, as the principle, N-piece coils (coil elements) to reduce the number of encoding steps to 1/N. As a result, a magnetic resonance imaging system that comprises a single whole-body coil, as seen in conventional systems, has a problem that the fast imaging cannot be done.

The present embodiment overcomes this difficulty. Even if only a single whole-body is incorporated in the system, the sensitivity distribution of a whole-body coil can be changed relatively by moving the couch. This is equivalent to the situation that the same region of an object is scanned with different sensitivity distributions of coils. Based on this fact, the couch movement is unitized in the present embodiment, so that the fast imaging on the principle of reducing the number of encoding steps is conducted.

For example, at first, the number of encoding steps necessary for reconstructing a single image is reduced into half at a certain couch position, then scans are performed. Those scans include a coil-sensitivity-distribution-measuring scan and an imaging scan. This provides a single image of a given region to be imaged at the first couch position. The couch tabletop is then moved by a predetermined distance (for example, a distance that corresponds to half of a length of the whole-body coil in the Z-axis direction). Like the above, in order to obtain a further image, the same region of the object is subject to scans with half of the number of encoding steps. Those scans carried out at the second couch position include a further coil-sensitivity-distribution-measuring scan and a further imaging scan. Namely, moving the couch tabletop by the given distance is equivalent to the situation that there are virtually two whole-body coils (refer to FIG. 14). The whole-body coil is apparently two in number to a given region to be imaged of the object, even if only a single whole-body coil is adopted.

Each of the images obtained by the two times of scan causes an aliasing phenomenon therein. However, since being equivalent to two images obtained with whole-body coils of different sensitivity distributions, a single original image is reconstructed, from which the aliasing is removed by calculation on the technique that the foregoing paper provides.

In particular, the imaging according to the present embodiment is preferable to an ultra short-axis type of magnetic resonance imaging system. This system, which comprises a single whole-body coil, requires several times of scanning to obtain an image of an ordinal region to be imaged in the Z-axis direction, because the axial length in the Z-axis direction is shorter. For example, the axial length is about 100 cm and its region to be imaged is some 25 cm. The imaging according to the present embodiment can be applied to this system. For instance, the read-out direction is assigned to the Z-axis direction, an FOV in the Z-axis direction is doubled (which is for example the same as the FOV of a region to be imaged by the conventional long-axis type of magnetic resonance imaging system), the number of encoding steps is reduced into half, and the couch is moved, each time of scan (in total, two times of scans), by a distance corresponding to one region imaged by the conventional magnetic resonance imaging system. This makes it possible that sagital and coronal imaging, which was difficult for the ultra short-axis type of magnetic resonance imaging system, to be performed in the same time as that for the ordinal MRI.

In addition, the couch movement and image processing for the foregoing single whole-body coil may be applied to the foregoing configuration of FIG. 12 in which the multiple RF coils are used. Further, such couch movement and image processing are also applicable to the configuration of the multiple RF coils of positions are fixed as shown in FIG. 11.

Referring to FIGS. 15 to 18, another embodiment of the present invention will now be described. Like the seventh embodiment, this embodiment is characterized by fast imaging based on changes in sensitivity distributions of one or more reception coils when a couch is moved.

Particularly one preferred embodiment of the fast imaging is fast contrast MR angiography (MRA) carried out under injection of an MR contrast agent in order to obtain images and/or measurement information in which its contrast effect is reflected.

The present embodiment will be described about a configuration in which the foregoing fast imaging is performed as the fast contrast MR angiography, but the configuration is not limited to such fast contrast MRA.

Figure 15:
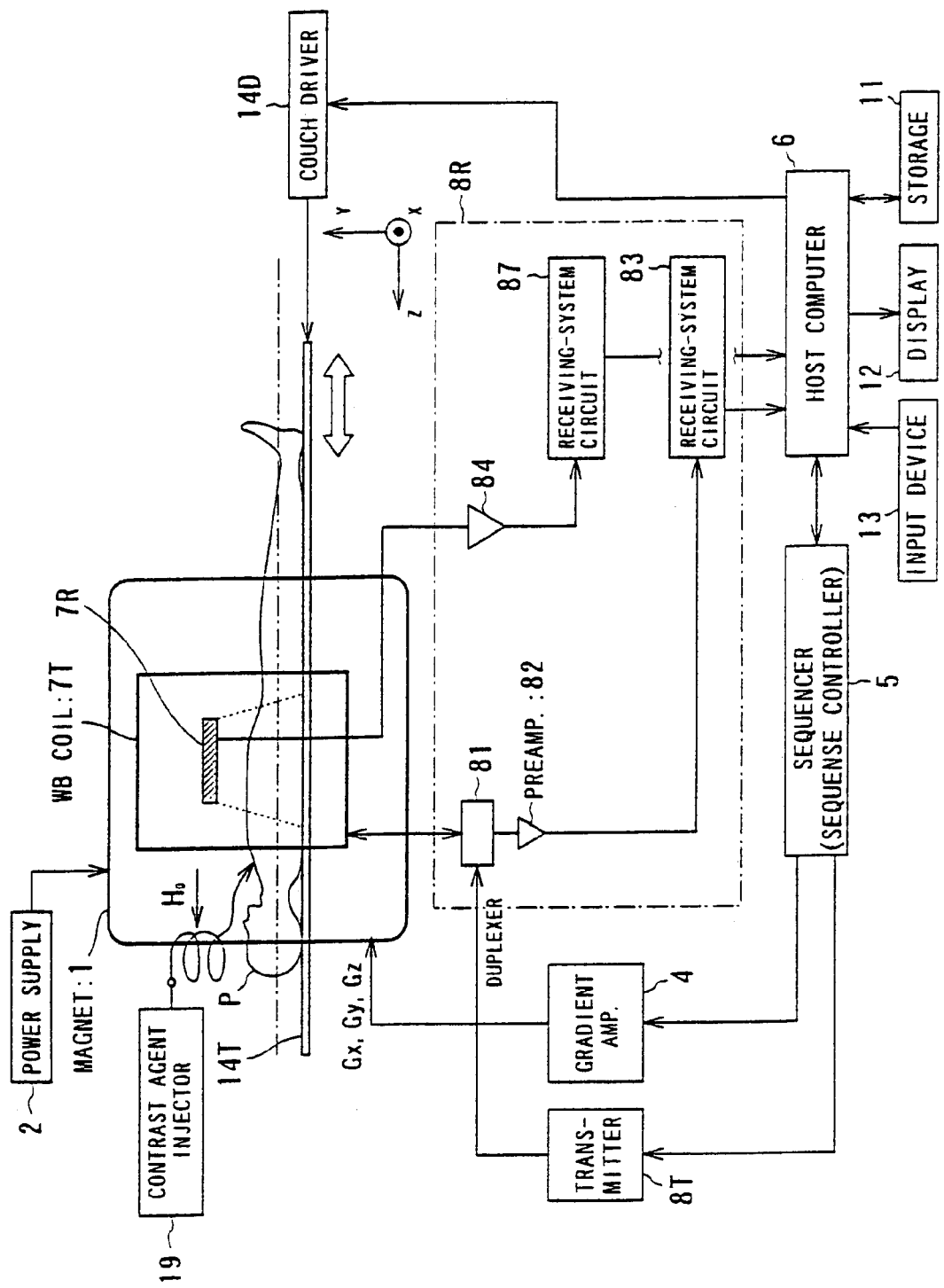
FIG. 15 outlines the configuration of a magnetic resonance imaging system according to an eighth embodiment of the present invention, the system being directed to fast contrast MRA using a single reception coil with a couch moved.

FIG. 15 shows a schematic form of a magnetic resonance imaging system capable of performing the fast contrast MRA. This system includes, as shown in FIG. 15, a whole-body (WB) coil 7T serving as a transmission coil and a single reception coil 7R, which are fixedly incorporated in the bore of a magnet 1. The reception coil 7R constitutes the coil member of the present invention. The reception coil 7R is connected to a receiving-system circuit 87 via a preamplifier 84, so that predetermined reception processing is done. This reception processing produces echo data, which are then sent to a host computer 6.

An MR contrast agent can be injected by a contrast agent injector 19 into an object P to be imaged lied on the tabletop 14T of a couch.

The remaining hardware configurations in this system are identical to those in FIG. 3, excepting that the receiving-system circuit is one in number.

Normally, in performing the contrast MRA, imaging is started before the injection of a contrast agent. And the same region to be imaged is repeatedly scanned to acquire echo data in sequence. The echo data are subjected to conversion to image data, which are used for observation of changes in intensity resulting from arrival of the contrast agent. A more precise understanding of temporal changes in intensity requires that imaging be done with higher temporal resolution.

Because only one reception coil 7R is used in this embodiment, the fast contrast MRA will be performed with the couch table 14T moved, like the foregoing seventh embodiment.

Figure 16A:
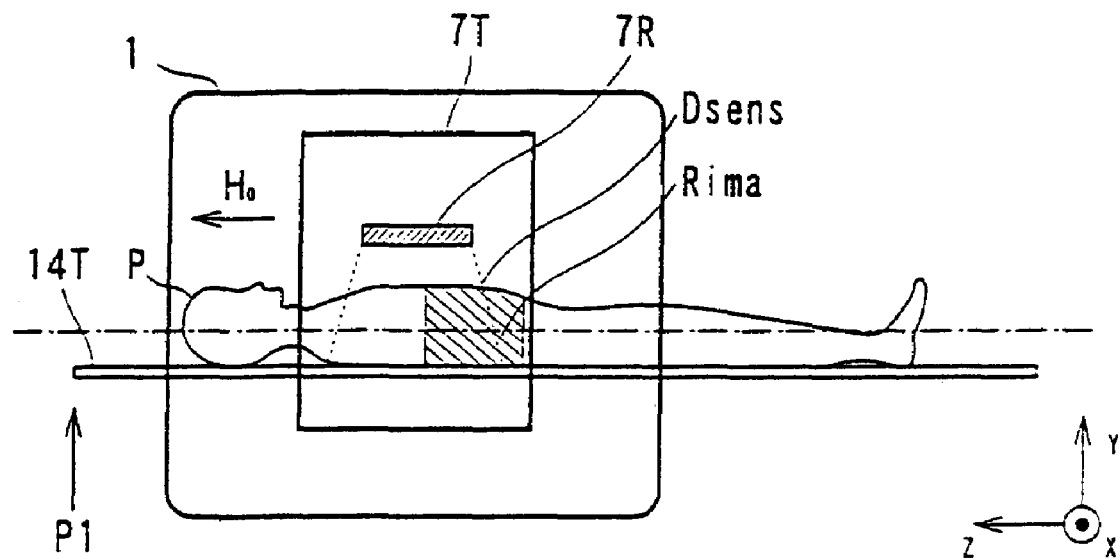
FIGS. 16A and 16B illustrate the positional relationship between moved positions of a couch's tabletop (a first and second couch's tabletop positions) and the sensitivity region of the reception coil.
Figure 16B:
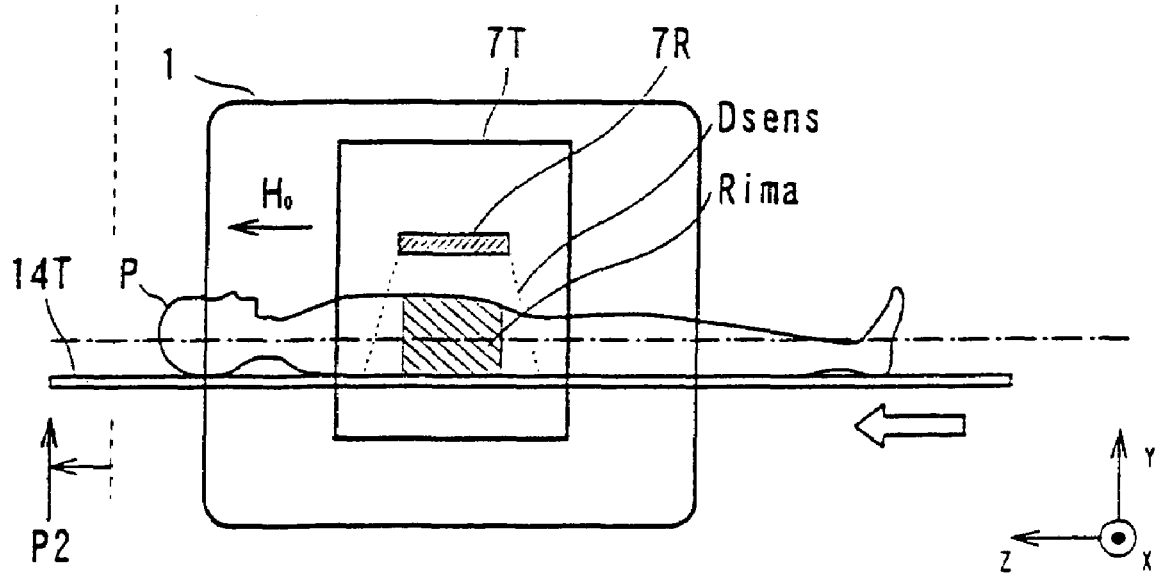

Practically, as shown in FIGS. 16A and 16B, the tabletop 14T is moved to two different positions P1 and P2 of which coil sensitivity distributions differ from each other. The first tabletop position P1 is determined as shown in FIG. 16A. That is, this position P1 is set such that a region to be imaged Rima (hatching portion) of an object P is comparatively shifted from the center of a sensitivity distribution region Dsens of the reception coil 7R, with the region Rima crossing a boundary of the sensitivity distribution region Rsens. In addition, the second tabletop position P2 is obtained by moving the tabletop 14T by a predetermined distance along the Z-axis direction (i.e., the longitudinal direction of the couch), as shown in FIG. 16B. The second tabletop position P2 is set such that the region to be imaged Rima of the object P is located within the sensitivity distribution region Dsens of the reception coil 7R on condition that both of the regions' centers agree with each other. Thus, the movement of the tabletop 14T will cause the same imaged region Rima to be scanned at two positions whose coil sensitivity distributions differ from each other.

In this fast contrast MRA, preparation scans are performed at the first tabletop position P1 in advance. The preparation scans include a first sensitivity distribution measuring scan for measuring the sensitivity distribution of the reception coil 7R and one time of imaging scan for producing an MRA image on the sub-encoding method requiring unfolding processing. A second sensitivity distribution measuring scan will be described later. At the first tabletop position P1, its coil sensitivity distribution Dsens is different from that at the second tabletop position P2 later described, by amounts that correspond to a shifted length of the imaged region Rima from the center of its sensitivity distribution region Dsens. But degrees of spatial resolution at both of the poisons are the same.

The first sensitivity distribution measuring scan is performed one time for shortening the scan time and employs a faster pulse sequence. For instance, when a sequence used by the imaging scan in this contrast MRA is a three-dimensional FFE scan and its scan matrix size is "128×256×32," a matrix size used by the sensitivity measuring scan is set to, for example, "16×32×4." The imaging scan uses a desired pulse sequence for contrast MRA in which its encoding steps are reduced into half.

By contrast, at the second tabletop position P2, the main scans are performed. This main scans include a second sensitivity distribution measuring scan performed in the similar way to the above and a plurality of times of imaging scans for respectively producing an MRA image on the sub-encoding method requiring unfolding processing. The second sensitivity distribution measuring scan is performed one time with a matrix size of lower spatial resolution, such as "16×32×4" in consideration of a shortened scan time and a scanning purpose, like the first one. Each imaging scan is performed using a desired three-dimensional pulse sequence for contrast MRA of which encode (phase-encode) steps are reduced into half. By reducing the number of encode steps in this way, temporal resolution is improved twice.

Figure 17:
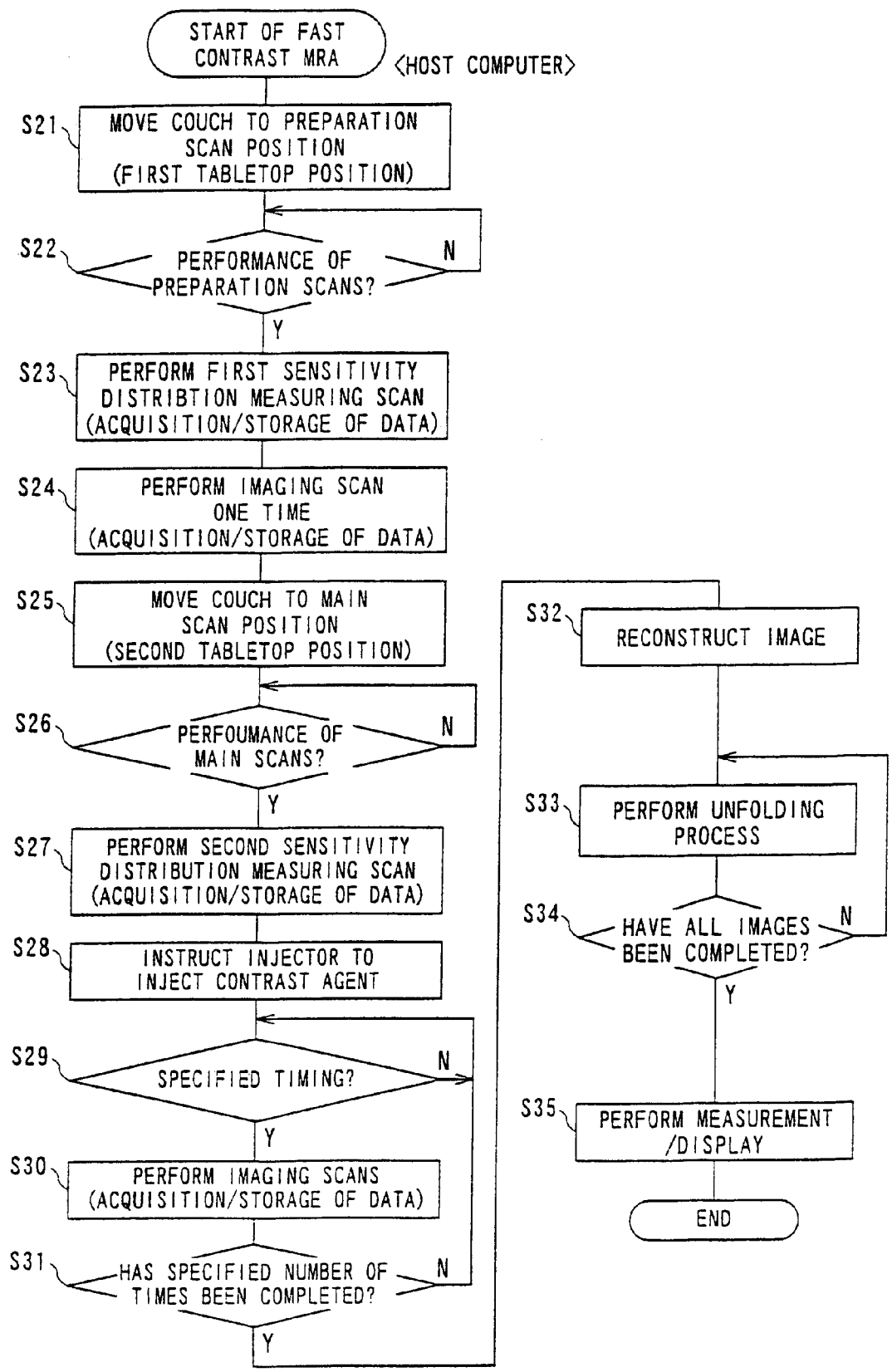
FIG. 17 is a flowchart outlining processing carried out by a host computer during the fast contrast MRA.

FIG. 17 shows the processing for the fast contrast MRA instructed by the host computer 6.

First, the host computer sends a command to the couch driver 14D to move the tabletop 14T of the couch to the first tabletop position P1 (refer to FIG. 16A), then determines if the preparation scans should be executed or not (Steps S21 and S22 in FIG. 17).

If determined that the system is ready for the preparation scans, the host computer 6 instructs the necessary units to perform the first sensitivity distribution measuring scan, thus echo data being acquired and stored (Step S23). Then, the imaging scan is instructed to be performed one time, thus echo data being acquired and stored (Step S24).

The host computer 6 then sends a command to the couch driver 14D to move the tabletop 14T to the second tabletop position P2 (refer to FIG. 16B), before the determination if or not the main scans should be performed is made (Steps S25 and S26).

If it is determined that the system is ready for the main scans, the host computer 6 instructs the necessary units to perform the second sensitivity distribution measuring scan (Step S27). Thus echo data for sensitivity distribution measurement are acquired and stored into an inner memory of the host computer. The host computer 6 further sends to the contrast agent injector 19 a command for the injection of a contrast agent (Step S28). In response to this command, the injector 19 starts to inject the contrast agent into the object P after waiting for a certain interval of time.

The host computer 6 waits for the interval of time predetermined to be in synchronism with the start of injection of the contrast agent, then instructs the necessary units to perform the imaging scans (Steps S29 and S30). Thus echo data on each imaging scan are acquired and stored into the inner memory of the host computer 6. The imaging scan at the second tabletop position P2 is repeated a plurality of times, for example, to meet a purpose for measurement of an intensity enhancement effect of the contrast agent.

On completion of a series of movements of the tabletop 14T and scans, the host computer 6 performs a three-dimensional Fourier transform with the sets of echo data acquired by the coil sensitivity distribution measuring scans and the imaging scans, respectively. Images are thus reconstructed (Step S32).

In each of the three-dimensional images for contrast MRA acquired at the second tabletop position P2, aliasing is caused along their encode directions (phase-encode direction and slice encode direction). Therefore, the host computer 6 uses the previously acquired data) to unfold each set of a three-dimensional image data acquired through the imaging scans at the second table position P2 (Steps S33 and S34). Those previous data include coil sensitivity distribution measurements (image data) and image data from the one time of imaging scan, both are acquired at the first tabletop position P1, and coil sensitivity distribution measurements (image data) acquired at the second tabletop position P1 for the contrast MRA. The unfolding uses the foregoing known technique.

This unfolding process removes folded data (aliasing) from the three-dimensional image data at the second tabletop position P2. Those image data are then subject to various kinds of measurement and display (Step S35).

Figure 18:
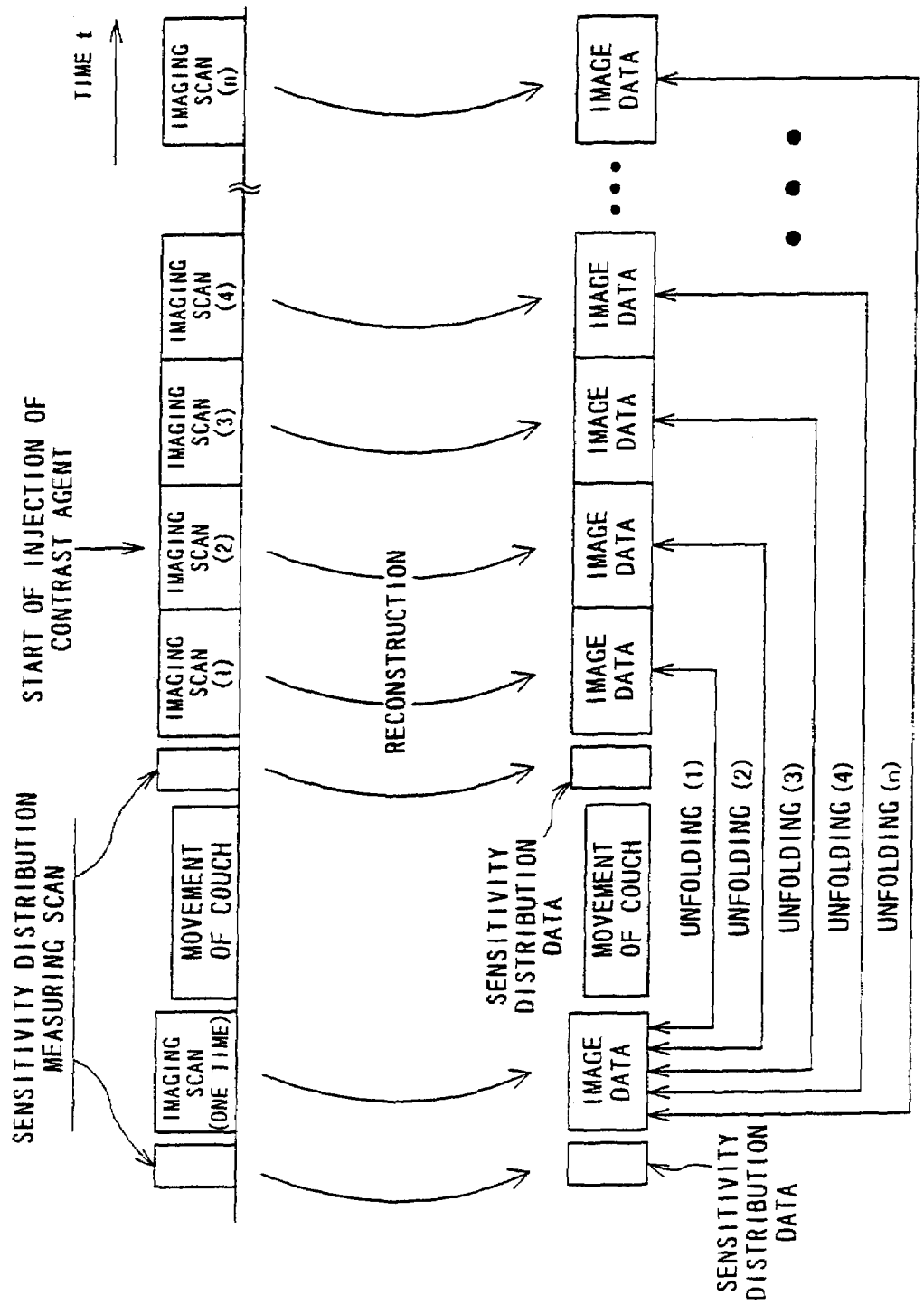
FIG. 18 illustrates timing among scans for the fast contrast MRA, couch movement, and injection of a contrast agent, and acquisition of data used for unfolding processing.

FIG. 18 pictorially shows two timing flows. One flow shows each scan, the couch movements, and the injection of the contrast agent, while the other shows the relationships of usage of data for the unfolding.

In this way, for the single reception coil, the movement of the couch (tabletop) allows a region to be imaged of an object to be moved to two positions whose sensitivity distributions for the reception coil are different from each other. Therefore, the fast imaging with less encode step numbers can be performed as an equivalent way to the foregoing technique using a plurality of reception coils. Additionally, at one of the two positions, a contrast agent can be injected to scan a region to be imaged. And removing folded data by an unfolding process lead to fast contrast MRA with higher temporal resolution.

The imaging has been described with respect to an MRA in the above embodiment, but the imaging using a single reception coil can be carried out with no injection of a contrast agent. In such a case, the fast imaging may be performed on the sub-encoding method, although the reception coil is one in number. In other words, like the above eighth embodiment, a region to be imaged may be moved relatively to the one reception coil, so that a plurality of sets of echo data whose sensitivity to the reception RF coil is changed set by set are obtained. This is virtually equivalent to a configuration in which two reception coils are used.

Although the eighth embodiment has used one reception coil, this embodiment is able to adopt two or more reception coils. In cases the number of reception coils is increased, the speed of imaging can be doubled under a limitation that the same region can be imaged.

Further, a whole-body coil for transmission/reception can be used.

In the above eighth embodiment and its modifications, the scans are performed at the two positions by changing relative positional relationships between the couch and the magnet, such as moving the tabletop. Instead, the scans can be done a large number of times more than two times. For example, the scans are done as the position is changed N (>3) times, the imaging can be speed up to N times, as long as the plurality of scan positions are separated from each other so as to satisfy a condition for the sub-encoding method. Namely, the condition is that the linearly independence should be maintained among the coil sensitivity distributions.

Further, each embodiment is able to provide an axial image with high speeds. To realized this, coils are disposed, as reception coil groups, at upper/lower and right/left side positions of an object so that those coils are faced to each other and the imaging on the sub-encoding method is performed using the sensitivity distribution of each coil.

Although the description above contains many specificities, these should not be construed as limiting the scope of the invention but as merely providing illustrations of some of the presently preferred embodiments of this invention. Thus an originally skill in the art can further provide a wide variety of modifications and changes without departing from the gist of this invention, based on the description in the appended claims.

As described above, in the foregoing magnetic resonance imaging system and MR imaging method, in cases multiple RF coils are used as a reception coil to perform imaging based on the moving bed technique, it is unnecessary for an operator to manually switch over coils with the couch moved. Thus the operation can be saved, the imaging can be speeded up, and the couch can be moved precisely.

Further, in cases multiple RF coils are used as a reception coil to perform imaging based on the moving bed technique, fast imaging that improves temporal resolution can be performed with ease, providing an MR image of a higher depiction performance.

Even when only one reception coil is disposed, the moving bed technique can be adopted for fast imaging. The moving bed technique can be utilized for fast contrast MR angiography (MRA). Thus the moving bed technique can have more generalized in usage.

The invention claimed is:
1. A magnetic resonance imaging system comprising:
   a magnet configured to generate a static magnetic field containing a uniform region whose magnetic intensity is uniform;
   a couch movable in a longitudinal direction passing through the static magnetic field, an object to be imaged disposed on the couch;
   a reception multiple RF coil including a plurality of coil members positioned around the object;
   an identification generating unit configured to generate an identification number of each coil member, the identification generating unit being disposed at each of the plurality of coil members,
   a size memorizing unit configured to memorize a size of each of the plurality of coil members in the longitudinal direction, the size corresponding to the identification number of each coil member generated by the identification generating unit,
   a disposal detecting unit configured to identify each signal line of the plurality of coil members to detect a disposal state of the plurality of coil members in the longitudinal direction;
   a determination unit configured to determine the size of each coil by referencing detection information about the coil disposal state detected by the disposal detecting unit to the size memorizing unit;
   a position changing unit configured to change a relative position of the couch with respect to the magnet in the longitudinal direction in accordance with both of a length of each of the plurality of coil members in the longitudinal direction and the size determined by the determination unit when the object is being imaged;
   a scanning unit configured to scan the object by applying a given train of pulses to the object at different positions determined by the position changing unit;

a reception unit configured to receive through the multiple RF coil an echo signal in response to the train of pulses applied by the scanning unit;

a reception-processing unit comprising a selection element configured to automatically select, from the echo signal received by each of the plurality of coil members, an echo signal received by the coil member located at a center of the uniform region in the longitudinal direction based on both the size determined by the determination unit and the coil disposal state detected by the disposal detecting unit, and a processing element configured to process the selected echo signal into echo data; and an image producing unit configured to produce an MR image based on the echo data from the reception-processing unit.

2. The magnetic resonance imaging system of claim 1, wherein the position changing unit is configured to change the position of the couch so that a center position of each of the plurality of coil members in the longitudinal direction corresponds to the uniform region of the static magnetic field.

3. The magnetic resonance imaging system of claim 1, wherein the selection element comprises:

signal level detecting means for detecting a level of the echo signal received by each of the plurality of coil members; and signal selecting means for automatically selecting the echo signal received by the coil member located at the center of the uniform region in the longitudinal direction based on changes in the level of the echo signal detected by the signal level detecting means.

4. The magnetic resonance imaging system of claim 1, wherein each of the plurality of coil members comprising the multiple RF coil is an array type of RF coil comprising a plurality of coil elements.

5. The magnetic resonance imaging system of claim 1, wherein each of the plurality of coil members comprising the multiple RF coil is a whole-body coil.

6. The magnetic resonance imaging system of claim 1, wherein the multiple RF coil is fixed to at least one of the object or the couch.

7. The magnetic resonance imaging system of claim 1, further comprising a movement amount determining unit configured to determine an amount of movement of the couch for the position changing unit based on a central position of a coil member of the reception multiple RF coil and an imaging region set by using a light projector.

* * * * *